US011676532B2

(12) United States Patent
Wang et al.

(10) Patent No.: US 11,676,532 B2
(45) Date of Patent: Jun. 13, 2023

(54) DISPLAY SUBSTRATE, DISPLAY PANEL, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Mengqi Wang, Beijing (CN); Haigang Qing, Beijing (CN); Zhengkun Li, Beijing (CN); De Li, Beijing (CN); Hong Yi, Beijing (CN); Shilong Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/434,119

(22) PCT Filed: Nov. 13, 2020

(86) PCT No.: PCT/CN2020/128675
§ 371 (c)(1),
(2) Date: Aug. 26, 2021

(87) PCT Pub. No.: WO2022/099610
PCT Pub. Date: May 19, 2022

(65) Prior Publication Data
US 2022/0180809 A1 Jun. 9, 2022

(51) Int. Cl.
*H01L 27/32* (2006.01)
*G09G 3/3225* (2016.01)

(52) U.S. Cl.
CPC ....... *G09G 3/3225* (2013.01); *H01L 27/3223* (2013.01); *H01L 27/3234* (2013.01);
(Continued)

(58) Field of Classification Search
CPC ............ H01L 27/3225; H01L 27/3265; H01L 27/3244; H01L 51/5012; H01L 27/3223;
(Continued)

(56) References Cited

U.S. PATENT DOCUMENTS 9,324,740 B2 4/2016 Lee et al.
9,941,169 B2 4/2018 Lee et al.
(Continued)

FOREIGN PATENT DOCUMENTS

CN 104733499 A 6/2015
CN 106991990 A 7/2017
(Continued)

*Primary Examiner* — Duc Q Dinh
(74) *Attorney, Agent, or Firm* — Westman, Champlin & Koehler, P.A.

(57) ABSTRACT

A display substrate, a display panel, and a display device are provided. The display substrate includes: a base substrate; a plurality of sub-pixels in the display pixel region, wherein each sub-pixel includes a pixel driving circuit; a plurality of first dummy sub-pixel structures on the base substrate and in the first dummy pixel region, wherein at least one first dummy sub-pixel structure includes a compensation capacitor; and a plurality of scan signal lines arranged on the base substrate and configured to transmit a scan signal to the pixel driving circuit. At least one scan signal line extends through the display pixel region and the first dummy pixel region, and the at least one scan signal line is electrically connected to the pixel driving circuit of each sub-pixel in a row of sub-pixels and is further electrically connected to the compensation capacitor of the at least one first dummy sub-pixel structure.

17 Claims, 21 Drawing Sheets

(52) U.S. Cl.
CPC ...... *H01L 27/3265* (2013.01); *H01L 27/3276* (2013.01); *G09G 2300/0413* (2013.01); *G09G 2300/0439* (2013.01); *G09G 2300/0842* (2013.01)

(58) Field of Classification Search
CPC ........ H01L 27/3276; G09G 2300/0413; G09G 2300/0439; G09G 2300/0842; G09G 2300/0426; G09G 3/3233; G09G 2300/0861; G06F 1/1605; G06F 1/1652; G09F 9/302
See application file for complete search history.

(56) References Cited

U.S. PATENT DOCUMENTS

| | | | | |
|---|---|---|---|---|
| 10,290,694 | B2 | 5/2019 | Xiang et al. | |
| 10,403,194 | B2 | 9/2019 | Li et al. | |
| 10,460,656 | B2 | 10/2019 | Xi et al. | |
| 10,629,488 | B2 | 4/2020 | Lee et al. | |
| 10,868,098 | B2 | 12/2020 | Chen | |
| 10,978,534 | B2 | 4/2021 | Chen | |
| 10,985,068 | B2 | 4/2021 | Lee et al. | |
| 11,251,235 | B2 | 2/2022 | Yoon et al. | |
| 11,328,657 | B2 * | 5/2022 | Fei | G09G 3/32 |
| 2015/0179724 | A1 | 6/2015 | Lee et al. | |
| 2016/0204180 | A1 | 7/2016 | Lee et al. | |
| 2018/0031535 | A1 | 2/2018 | MacFarland et al. | |
| 2018/0190190 | A1 | 7/2018 | Xi et al. | |
| 2018/0197779 | A1 | 7/2018 | Lee et al. | |
| 2018/0219058 | A1 * | 8/2018 | Xiang | H01L 27/3225 |
| 2018/0342194 | A1 | 11/2018 | Li et al. | |
| 2019/0108789 | A1 | 4/2019 | Tsuge | |
| 2020/0105849 | A1 * | 4/2020 | Kim | H01L 27/3258 |
| 2020/0119121 | A1 | 4/2020 | Chen | |
| 2020/0127071 | A1 | 4/2020 | Chen | |
| 2020/0176526 | A1 | 6/2020 | Yoon et al. | |
| 2020/0176539 | A1 * | 6/2020 | Sung | G09G 3/3233 |
| 2020/0219770 | A1 | 7/2020 | Lee et al. | |
| 2021/0151542 | A1 * | 5/2021 | Choe | H01L 27/3265 |

FOREIGN PATENT DOCUMENTS

| | | | | | |
|---|---|---|---|---|---|
| CN | 107633807 | A | | 1/2018 | |
| CN | 107994060 | A | | 5/2018 | |
| CN | 108010947 | A | | 5/2018 | |
| CN | 108010951 | A | * | 5/2018 | H01L 27/3276 |
| CN | 108630735 | A | | 10/2018 | |
| CN | 108831906 | A | | 11/2018 | |
| CN | 109148480 | A | | 1/2019 | |
| CN | 109728005 | A | | 5/2019 | |
| CN | 110649080 | A | | 1/2020 | |
| CN | 210245497 | U | | 4/2020 | |
| CN | 111261043 | A | | 6/2020 | |
| CN | 111599282 | A | | 8/2020 | |

* cited by examiner

DISPLAY SUBSTRATE, DISPLAY PANEL, AND DISPLAY DEVICE

CROSS-REFERENCE TO RELATED APPLICATION

This application is a Section 371 National Stage Application of International Application No. PCT/CN2020/128675, filed on Nov. 13, 2020, entitled "DISPLAY SUBSTRATE, DISPLAY PANEL AND DISPLAY DEVICE", the contents of which are incorporated herein by reference in their entireties.

TECHNICAL FIELD

The present disclosure relates to a field of display technology, and in particular to a display substrate, a display panel, and a display device.

BACKGROUND

With an increasing demand for diversified use of display device and an emergence of design requirements for a high screen-to-body ratio of display device, display device with a full screen is more and more favored by consumers. In a full-screen design, an opening may be formed in the display screen, and a hardware module such as a camera may be placed in the opening, so as to achieve the full-screen design. In this design, many normal light emitting pixels in a row where the opening is located are missing, resulting in a large difference between a load of the row where the opening is located and a load of other rows, which affects a charging time of the pixel circuit and has an adverse impact on a display effect.

The above information disclosed in this section is only for the understanding of the background of a technical concept of the present disclosure. Therefore, the above information may contain information that does not constitute a related art.

SUMMARY

In one aspect, there is provided a display substrate including a display pixel region, a first dummy pixel region and at least two openings, wherein the first dummy pixel region is located between the at least two openings, and wherein the display substrate includes: a base substrate; a plurality of sub-pixels arranged on the base substrate and located in the display pixel region, wherein the plurality of sub-pixels are arranged in an array in a first direction and a second direction, and each sub-pixel includes a pixel driving circuit; a plurality of first dummy sub-pixel structures arranged on the base substrate and located in the first dummy pixel region, wherein at least one first dummy sub-pixel structure includes a compensation capacitor; and a plurality of scan signal lines arranged on the base substrate and configured to transmit a scan signal to the pixel driving circuit, wherein at least one scan signal line extends through the display pixel region and the first dummy pixel region, and the at least one scan signal line is electrically connected to the pixel driving circuit of each sub-pixel in a row of sub-pixels and further electrically connected to the compensation capacitor of the at least one first dummy sub-pixel structure.

According to some exemplary embodiments, the display substrate further includes a first compensation connection part including a first compensation capacitor electrode, the first compensation connection part has one end electrically connected to the first compensation capacitor electrode and the other end electrically connected to the at least one scan signal line.

According to some exemplary embodiments, the display substrate further includes a first via hole exposing a portion of the at least one scan signal line, and the other end of the first compensation connection part is electrically connected to the at least one scan signal line through the first via hole.

According to some exemplary embodiments, the compensation capacitor further includes a second compensation capacitor electrode, and an orthographic projection of the first compensation capacitor electrode on the base substrate at least partially overlaps an orthographic projection of the second compensation capacitor electrode on the base substrate; the second compensation capacitor electrode includes a first through hole, and an orthographic projection of the first through hole on the base substrate falls within the orthographic projection of the first compensation capacitor electrode on the base substrate; the display substrate further includes a second via hole exposing a portion of the first compensation capacitor electrode, and the one end of the first compensation connection part is electrically connected to the first compensation capacitor electrode through the first through hole and the second via hole.

According to some exemplary embodiments, the pixel driving circuit includes at least a storage capacitor having a capacitance value less than that of the compensation capacitor.

According to some exemplary embodiments, the storage capacitor includes a first storage capacitor electrode and a second storage capacitor electrode, and an orthographic projection of the first storage capacitor electrode on the base substrate at least partially overlaps an orthographic projection of the second storage capacitor electrode on the base substrate; wherein an orthographic projection of an overlapping portion between the first compensation capacitor electrode and the second compensation capacitor electrode on the base substrate has an area greater than that of an orthographic projection of an overlapping portion between the first storage capacitor electrode and the second storage capacitor electrode on the base substrate.

According to some exemplary embodiments, the compensation capacitor includes a first compensation sub-capacitor and a second compensation sub-capacitor connected in parallel.

According to some exemplary embodiments, the orthographic projection of the first compensation capacitor electrode on the base substrate at least partially overlaps the orthographic projection of the second compensation capacitor electrode on the base substrate so as to form the first compensation sub-capacitor.

According to some exemplary embodiments, the display substrate further includes a third compensation capacitor electrode, and an orthographic projection of the third compensation capacitor electrode on the base substrate at least partially overlaps the orthographic projection of the second compensation capacitor electrode on the base substrate so as to form the second compensation sub-capacitor.

According to some exemplary embodiments, the first compensation capacitor electrode and the first storage capacitor electrode are located in a first conductive layer, and the second compensation capacitor electrode and the second storage capacitor electrode are located in a second conductive layer located on a side of the first conductive layer away from the base substrate.

According to some exemplary embodiments, the third compensation capacitor electrode and the first compensation connection part are located in a third conductive layer located on a side of the second conductive layer away from the base substrate.

According to some exemplary embodiments, the third compensation capacitor electrode and the first compensation connection part are connected to each other to form a continuously extending integral structure.

According to some exemplary embodiments, a size of the orthographic projection of the first compensation capacitor electrode on the base substrate in the first direction is greater than a size of the orthographic projection of the first storage capacitor electrode on the base substrate in the first direction; and/or a size of the orthographic projection of the first compensation capacitor electrode on the base substrate in the second direction is greater than a size of the orthographic projection of the first storage capacitor electrode on the base substrate in the second direction.

According to some exemplary embodiments, a size of the orthographic projection of the second compensation capacitor electrode on the base substrate in the first direction is greater than a size of the orthographic projection of the second storage capacitor electrode on the base substrate in the first direction; and/or a size of the orthographic projection of the second compensation capacitor electrode on the base substrate in the second direction is greater than a size of the orthographic projection of the second storage capacitor electrode on the base substrate in the second direction.

According to some exemplary embodiments, the display substrate further includes a plurality of driving voltage lines arranged on the base substrate and configured to provide driving voltage signals respectively to the plurality of sub-pixels located in the display pixel region, and the second compensation capacitor electrode is electrically connected to the driving voltage line.

According to some exemplary embodiments, the scan signal line is located in the first conductive layer; and/or the driving voltage line is located in the third conductive layer.

According to some exemplary embodiments, the display substrate further includes a semiconductor layer located on a side of the first conductive layer close to the base substrate, each of an orthographic projection of the first compensation capacitor electrode on the base substrate and an orthographic projection of the second compensation capacitor electrode on the base substrate does not overlap an orthographic projection of the semiconductor layer on the base substrate.

According to some exemplary embodiments, the display substrate further includes a second dummy pixel region located between the first dummy pixel region and the at least two openings; the display substrate further includes a plurality of dummy pixels arranged on the base substrate and located in the second dummy pixel region, wherein each dummy pixel includes at least a dummy capacitor having a capacitance value substantially equal to that of the storage capacitor.

According to some exemplary embodiments, the dummy capacitor includes a first dummy capacitor electrode and a second dummy capacitor electrode, and an orthographic projection of the first dummy capacitor electrode on the base substrate at least partially overlaps an orthographic projection of the second dummy capacitor electrode on the base substrate; a size of the orthographic projection of the first dummy capacitor electrode on the base substrate in the first direction is substantially equal to a size of the orthographic projection of the first storage capacitor electrode on the base substrate in the first direction; and/or a size of the orthographic projection of the first dummy capacitor electrode on the base substrate in the second direction is substantially equal to a size of the orthographic projection of the first storage capacitor electrode on the base substrate in the second direction; and/or a size of the orthographic projection of the second dummy capacitor electrode on the base substrate in the first direction is greater than a size of the orthographic projection of the second storage capacitor electrode on the base substrate in the first direction; and/or a size of the orthographic projection of the second dummy capacitor electrode on the base substrate in the second direction is greater than a size of the orthographic projection of the second storage capacitor electrode on the base substrate in the second direction.

According to some exemplary embodiments, the at least one scan signal line includes a $1^{st}$ scan signal line electrically connected to a plurality of sub-pixels and at least one first dummy sub-pixel in a row of sub-pixels and a $2^{nd}$ scan signal line electrically connected to a plurality of sub-pixels and at least one first dummy sub-pixel in another row of sub-pixels; and a number of the sub-pixels electrically connected to the $1^{st}$ scan signal line is less than a number of the sub-pixels electrically connected to the $2^{nd}$ scan signal line, and a number of the first dummy sub-pixels electrically connected to the $1^{st}$ scan signal line is greater than a number of the first dummy sub-pixels electrically connected to the $2^{nd}$ scan signal line.

According to some exemplary embodiments, the scan signal line extends in the first direction; and in the first dummy pixel region, the plurality of first dummy sub-pixel structures are arranged in the first direction and the second direction, and a number of the first dummy sub-pixel structures in one row firstly increases and then decreases in the second direction.

According to some exemplary embodiments, a size of the orthographic projection of the first compensation capacitor electrode on the base substrate in the first direction is in a range of 16 microns to 30 microns; and/or a size of the orthographic projection of the first compensation capacitor electrode on the base substrate in the second direction is in a range of 16 microns to 30 microns; and/or a size of the orthographic projection of the first storage capacitor electrode on the base substrate in the first direction is in a range of 10 microns to 16 microns; and/or a size of the orthographic projection of the first storage capacitor electrode on the base substrate in the second direction is in a range of 8 microns to 15 microns.

According to some exemplary embodiments, a size of the orthographic projection of the second compensation capacitor electrode on the base substrate in the first direction is in a range of 23 microns to 30 microns; and/or a size of the orthographic projection of the second compensation capacitor electrode on the base substrate in the second direction is in a range of 22 microns to 30 microns; and/or a size of the orthographic projection of the second storage capacitor electrode on the base substrate in the first direction is in a range of 18 microns to 23 microns; and/or a size of the orthographic projection of the second storage capacitor electrode on the base substrate in the second direction is in a range of 10 microns to 15 microns.

In another aspect, there is provided a display panel, including the display substrate described above.

In yet another aspect, there is provided a display device, including the display substrate described above or the display panel described above.

BRIEF DESCRIPTION OF THE DRAWINGS

By describing in detail exemplary embodiments of the present disclosure with reference to the drawings, the features and advantages of the present disclosure will become more apparent.

DETAILED DESCRIPTION OF EMBODIMENTS

Figure 1:
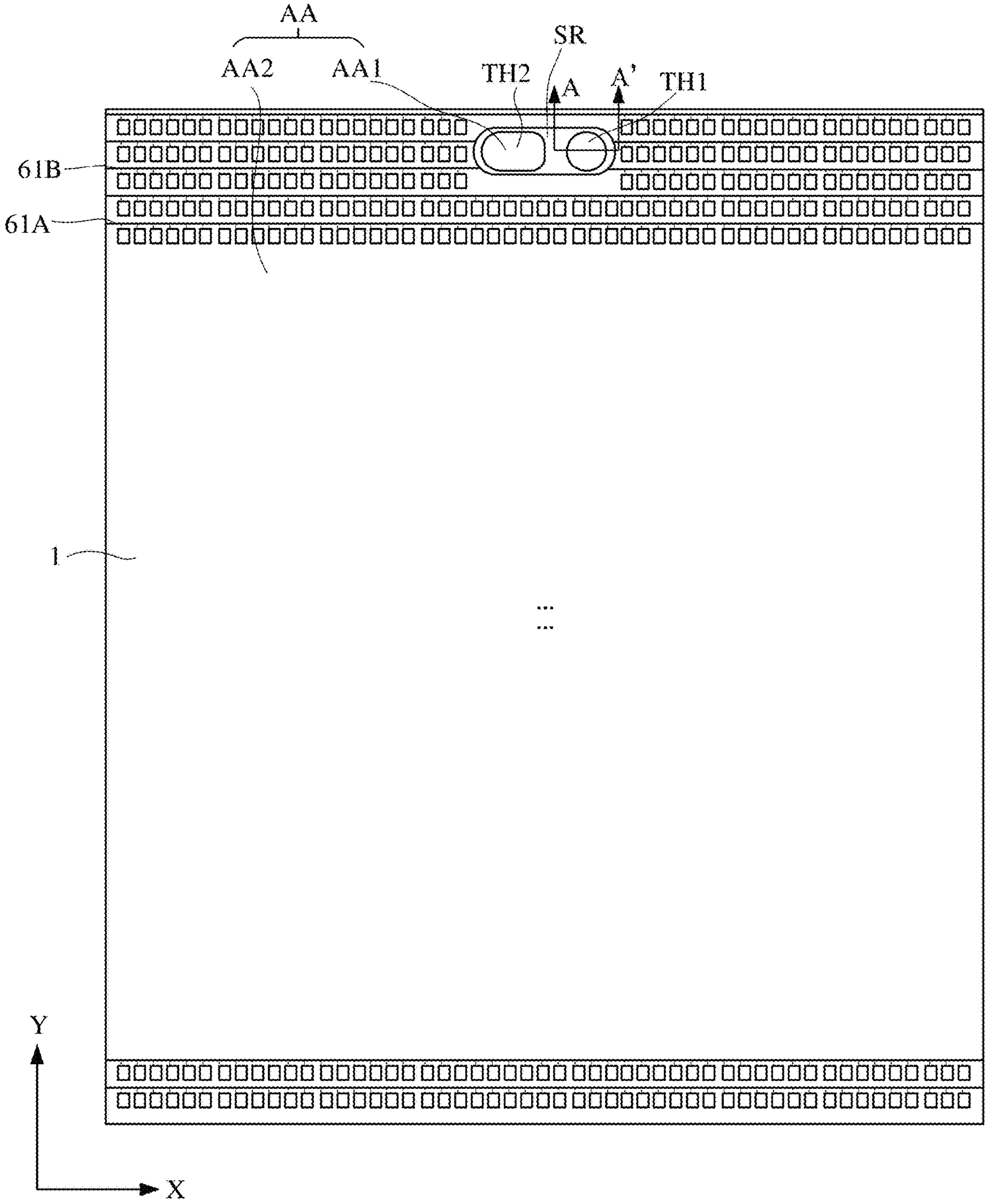
FIG. 1 shows a schematic plan view of a display device according to some embodiments of the present disclosure.

In order to make the objectives, technical solutions and advantages of the present disclosure more clear, the technical solutions of the embodiments of the present disclosure are clearly and completely described below with reference to the drawings. Obviously, the described embodiments are only a part but not all of the embodiments of the present disclosure. Based on the embodiments of the present disclosure, all other embodiments obtained by those ordinary skilled in the art without carrying out inventive effort fall within the protection scope of the present disclosure.

It should be noted that, in the drawings, for clarity and/or description purposes, size and relative size of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is present. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X axis, Y axis and Z axis are not limited to three axes of a rectangular coordinate system, and may be interpreted in a broader meaning. For example, the X axis, the Y axis and the Z axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", may be used herein to describe the relationship between one element or feature and another element or feature as shown in the figure. It should be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the other element or feature.

In the present disclosure, unless otherwise specified, the terms "substantially", "basically", "about", "approximately" and other similar terms are used as terms of approximation rather than as terms of degree, and they are intended to explain the inherent deviation of the measured or calculated value that will be recognized by those ordinary skilled in the art. Taking into account process fluctuation, measurement problems, and errors related to measurement of specific quantities (that is, limitations of a measurement system), the terms “substantially”, “basically”, “about” or “approximately” used in the present disclosure includes the stated value and means that the specific value determined by those ordinary skilled in the art is within an acceptable range of deviation. For example, “substantially”, “basically”, “about” or “approximately” may mean within one or more standard deviations, or within ±30%, ±20%, ±10% or ±5% of the stated value.

It should be noted that the expression “same layer” refers to a layer structure formed by first using the same film forming process to form a film layer for forming a specific pattern, and then using the same mask to pattern the film layer by using one-time patterning process. Depending on the specific patterns, the one-time patterning process may include multiple exposure, development or etching processes, and the specific pattern in the layer structure formed may be continuous or discontinuous. That is to say, a plurality of elements, components, structures and/or parts located in the “same layer” are made of the same material and formed by the same patterning process. Generally, a plurality of elements, components, structures and/or parts located in the “same layer” have roughly the same thickness.

Those skilled in the art should understand that, unless otherwise specified, the expressions “continuously extending”, “integral structure”, “overall structure” or similar expressions herein mean that a plurality of elements, components, structures and/or parts are located in the same layer and generally formed by the same patterning process during the manufacturing process, and that these elements, components, structures and/or parts are not separated or broken, but are implemented as a continuously extending structure.

The embodiments of the present disclosure provide at least a display substrate, a display panel, and a display device. The display substrate may include a display pixel region, a first dummy pixel region, and at least two openings. The first dummy pixel region is located between the at least two openings. The display substrate may include: a base substrate; a plurality of sub-pixels arranged on the base substrate and located in the display pixel region, wherein the plurality of sub-pixels are arranged in an array in a first direction and a second direction, and each sub-pixel includes a pixel driving circuit; a plurality of first dummy sub-pixel structures arranged on the base substrate and located in the first dummy pixel region, wherein at least one first dummy sub-pixel structure includes a compensation capacitor; and a plurality of scan signal lines arranged on the base substrate and configured to transmit scan signals to the pixel driving circuit, wherein at least one scan signal line extends through the display pixel region and the first dummy pixel region, and the at least one scan signal line is electrically connected to the pixel driving circuit of each sub-pixel in a row of sub-pixels and further electrically connected to the compensation capacitor of the at least one first dummy sub-pixel structure. In the display substrate provided by the embodiments of the present disclosure, the scan signal line is further electrically connected to the compensation capacitor, so that a load on each first scan signal line is consistent, thereby avoiding a display difference and ensuring a display quality.

FIG. 1 shows a plan view of a display device according to some exemplary embodiments of the present disclosure. For example, the display device may include a display substrate. The display substrate may be an electroluminescent display substrate, such as an OLED display substrate.

As shown in FIG. 1, the display substrate may include a display region AA, and at least one opening located in the display region AA. It should be noted that the “opening” mentioned in the present disclosure refers to a region on the display substrate for installing a hardware structure, which is called an opening in the present disclosure for the convenience of description. The opening includes but is not limited to the forms of a hole, a groove, an aperture, etc. Optionally, the hardware structure may include one or more of the structures of a front camera, a HOME key, an earpiece or a speaker. The specific installation manner of the hardware structure is not particularly limited in the embodiments of the present disclosure.

For example, the at least one opening may include two openings. For the convenience of description, the two openings may be referred to as a first opening TH1 and a second opening TH2, respectively. The first opening TH1 may have a substantially circular shape, and the second opening TH2 may have a combined shape of a rounded rectangle and a semicircle. The first opening TH1 and the second opening TH2 are spaced apart, and a solid part is provided in a spacing region SR between the first opening TH1 and the second opening TH2. For example, the display substrate may include a base substrate 1 and a plurality of film layers arranged on the base substrate 1. In a region where the first opening TH1 and the second opening TH2 are located, at least the film layers on the base substrate 1 are not provided. In the spacing region SR, at least some of the film layers on the base substrate 1 are provided. An orthographic projection of a combination of the first opening TH1, the spacing region SR and the second opening TH2 on the base substrate 1 has a shape of a racetrack.

It should be noted that in FIG. 1, two openings 10 are provided as an example for illustration. It should be understood that the embodiments of the present disclosure are not limited to this. In other embodiments, less (for example, one) or more openings may be provided. In addition, a shape of the opening may be determined according to a shape of the hardware structure to be installed. For example, a cross section of the opening in a direction parallel to the base substrate of the display substrate may have one or more of the shapes of a circle, an ellipse, a rectangle, a rounded rectangle, a square, a diamond, a trapezoid, etc.

In the embodiments of the present disclosure, by providing the opening in the display region and installing a hardware structure such as a camera in the opening, an orthographic projection of the hardware structure such as the camera on the base substrate falls within the at least one opening. In this way, functions such as under-screen camera may be realized, thereby increasing a screen-to-body ratio and achieving a full screen effect.

Continuing to refer to FIG. 1, the display region AA may include a first display region AA1 and a second display region AA2. For example, the first display region AA1 and the second display region AA2 do not overlap each other. For example, the second display region AA2 at least partially surrounds (for example, completely surrounds) the first display region AA1.

For example, the first display region AA1 may correspond to the region where the first opening TH1 and the second opening TH2 are located. For a display substrate with an under-screen camera, some sub-pixels may be arranged in the first display region AA1 to improve the display performance of the display substrate. In order to increase a light transmittance of the display region of the display substrate corresponding to the under-screen camera, a distribution density per unit area (e.g., PPI) of light emitting devices in the display region corresponding to the under-screen camera may be less than that of light emitting devices in other display regions of the display substrate. That is, the first display region AA1 is formed as a low pixel density region, and the second display region AA2 is formed as a high pixel density region.

Figure 2:
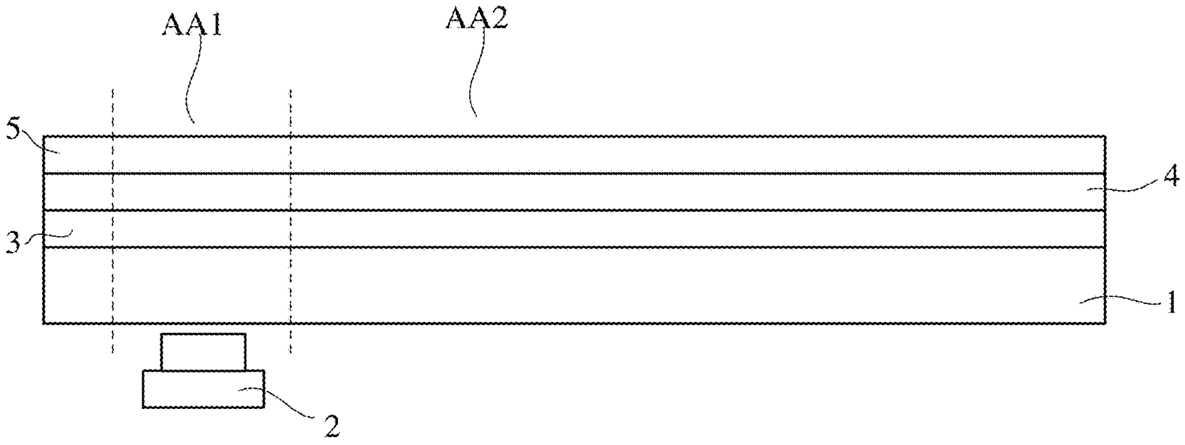
FIG. 2 shows a schematic cross-sectional view of the display device according to some exemplary embodiments of the present disclosure taken along line AA' in FIG. 1.

FIG. 2 shows a schematic cross-sectional view of the display device according to some exemplary embodiments of the present disclosure taken along line AA' in FIG. 1. As shown in FIG. 2, the display substrate may include a base substrate 1. A camera 2 may be provided on a rear surface of the base substrate 1 located in the first display region AA1 (shown as a lower side in FIG. 2, which may be, for example, a side opposite to a light exit direction during display), and the first display region AA1 may meet imaging requirements of the camera 2 for the light transmittance.

For example, the light transmittance of the first display region AA1 is greater than that of the second display region AA2. The camera 2 may be, for example, an image camera or an infrared camera. The camera 2 is configured to receive light rays from a display side of the display substrate (an upper side in FIG. 2, which may be, for example, the light exit direction during display, or a direction of human eyes during display), so that operations such as image capturing, distance sensing and light intensity sensing may be performed. These light rays may, for example, pass through the first display region AA1 and then irradiate on the camera to be sensed by the camera.

In addition, the display substrate may further include a driving circuit layer, a light emitting device layer and an encapsulation layer that are arranged on the base substrate 1. For example, a driving circuit layer 3, a light emitting device layer 4 and an encapsulation layer 5 are schematically shown in FIG. 2. The driving circuit layer 3 includes a driving circuit structure, and the light emitting device layer 4 includes a light emitting device such as an OLED. The driving circuit structure may control the light emitting devices of each sub-pixel to emit light, so as to achieve a display function. The driving circuit structure may include a thin film transistor, a storage capacitor, and various signal lines. The various signal lines may include gate lines, data signal lines, ELVDD power lines, ELVSS power lines and so on, so as to provide various signals such as control signals, data signals, power supply voltages and so on to the pixel driving circuit in each sub-pixel.

Figure 3:
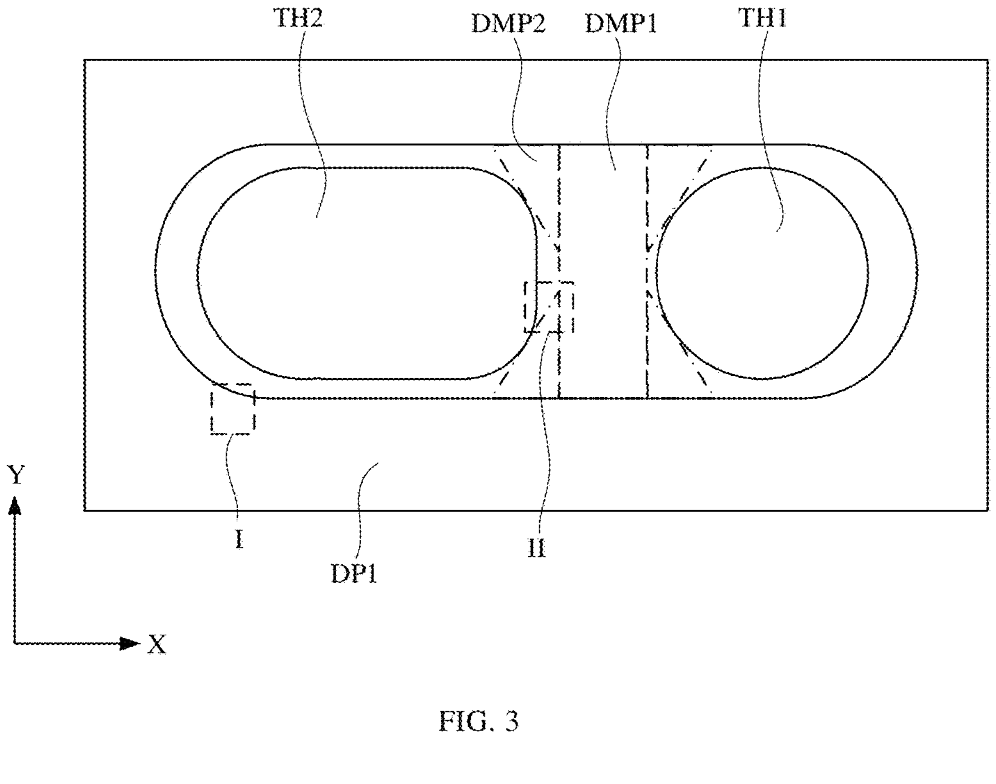
FIG. 3 shows a partial enlarged view of the display substrate according to some exemplary embodiments of the present disclosure at an opening part in FIG. 1.
Figure 4:
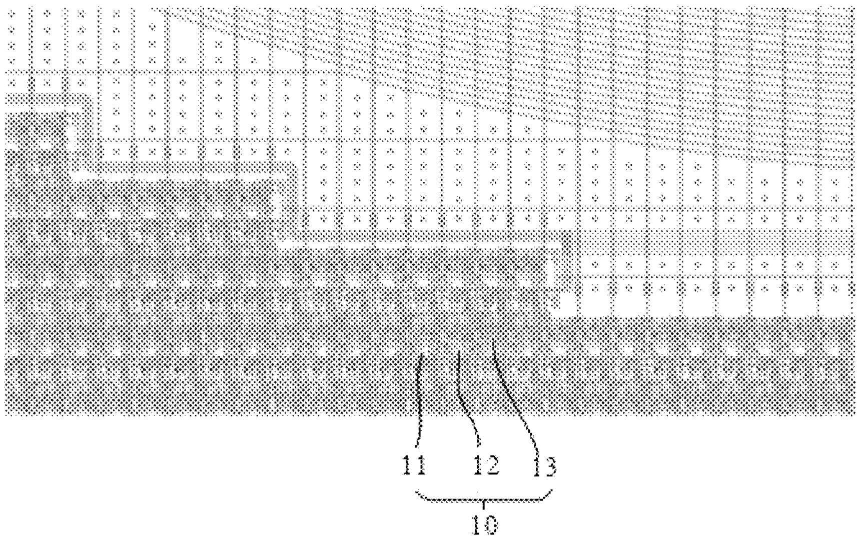
FIG. 4 shows a partial enlarged view of the display substrate according to some exemplary embodiments of the present disclosure at part I in FIG. 3.
Figure 5:
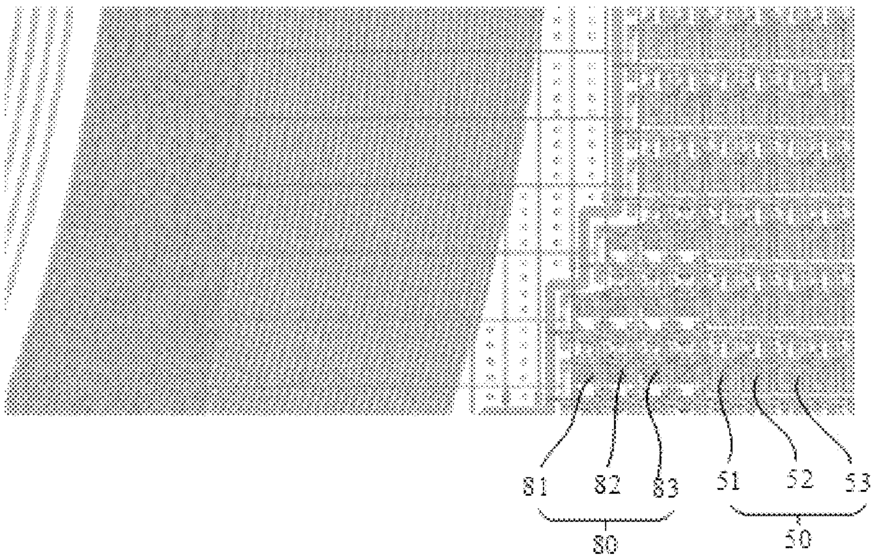
FIG. 5 shows a partial enlarged view of the display substrate according to some exemplary embodiments of the present disclosure at part II in FIG. 3.

FIG. 3 shows a partial enlarged view of the display substrate according to some exemplary embodiments of the present disclosure at an opening part in FIG. 1. FIG. 4 shows a partial enlarged view of the display substrate according to some exemplary embodiments of the present disclosure at part I in FIG. 3. FIG. 5 shows a partial enlarged view of the display substrate according to some exemplary embodiments of the present disclosure at part II in FIG. 3.

Referring to FIG. 1 to FIG. 5 in combination, the display substrate may include a display pixel region and a dummy pixel structure region.

It should be noted that the expression "display pixel region" herein means a region in which a plurality of pixels that may emit light to display an image are provided. The expression "dummy pixel region" means a region in which some pixel structures, similar to the structures of the plurality of pixels in the "display pixel region" but not used to emit light to display an image, are provided.

Referring to FIG. 3, the display pixel region may include a first display pixel region DP1 that may be located in the second display region AA2. A plurality of pixels 10 may be provided in the first display pixel region DP1. The plurality of pixels 10 may be arranged on the base substrate 1 in an array in a first direction X and a second direction Y. For example, each of the plurality of pixels 10 may include a first sub-pixel 11, a second sub-pixel 12, and a third sub-pixel 13. For ease of understanding, the first sub-pixel 11, the second sub-pixel 12 and the third sub-pixel 13 may be described as a red sub-pixel, a green sub-pixel and a blue sub-pixel, respectively, but the embodiments of the present disclosure are not limited thereto.

It should be understood that, in the embodiments of the present disclosure, each sub-pixel located in the first display pixel region DP1 includes a pixel driving circuit and a light emitting device. For example, the light emitting device may be an OLED light emitting device, including an anode electrode, an organic light emitting layer and a cathode electrode that are stacked. The pixel driving circuit may include a plurality of thin film transistors and at least one storage capacitor.

The dummy pixel region may include a first dummy pixel region DMP1 that may be located in the spacing region SR. A plurality of first dummy pixel structures 50 may be provided in the first dummy pixel region DMP1. The plurality of first dummy pixel structures 50 may be arranged on the base substrate 1 in an array in the first direction X and the second direction Y. The plurality of first dummy pixel structures 50 may include a plurality of first dummy sub-pixel structures 51, 52 and 53 corresponding to the plurality of sub-pixels located in the first display pixel region DP1. It should be noted that in the embodiments of the present disclosure, the dummy sub-pixel structures do not emit light. They are denoted as 51, 52 and 53 only in order to correspond to the plurality of sub-pixels 11, 12 and 13 described above, but the embodiments of the present disclosure are not limited thereto.

It should be noted that although in the embodiments shown, the first direction X and the second direction Y are perpendicular to each other, the embodiments of the present disclosure are not limited thereto.

Hereinafter, a 7T1C pixel driving circuit is illustrated by way of example in describing a structure of the pixel driving circuit of each sub-pixel located in the first display pixel region DP1 in detail. However, the embodiments of the present disclosure are not limited to the 7T1C pixel driving circuit. In a case of no conflict, any other known pixel driving circuit structures may be applied to the embodiments of the present disclosure.

Figure 6:
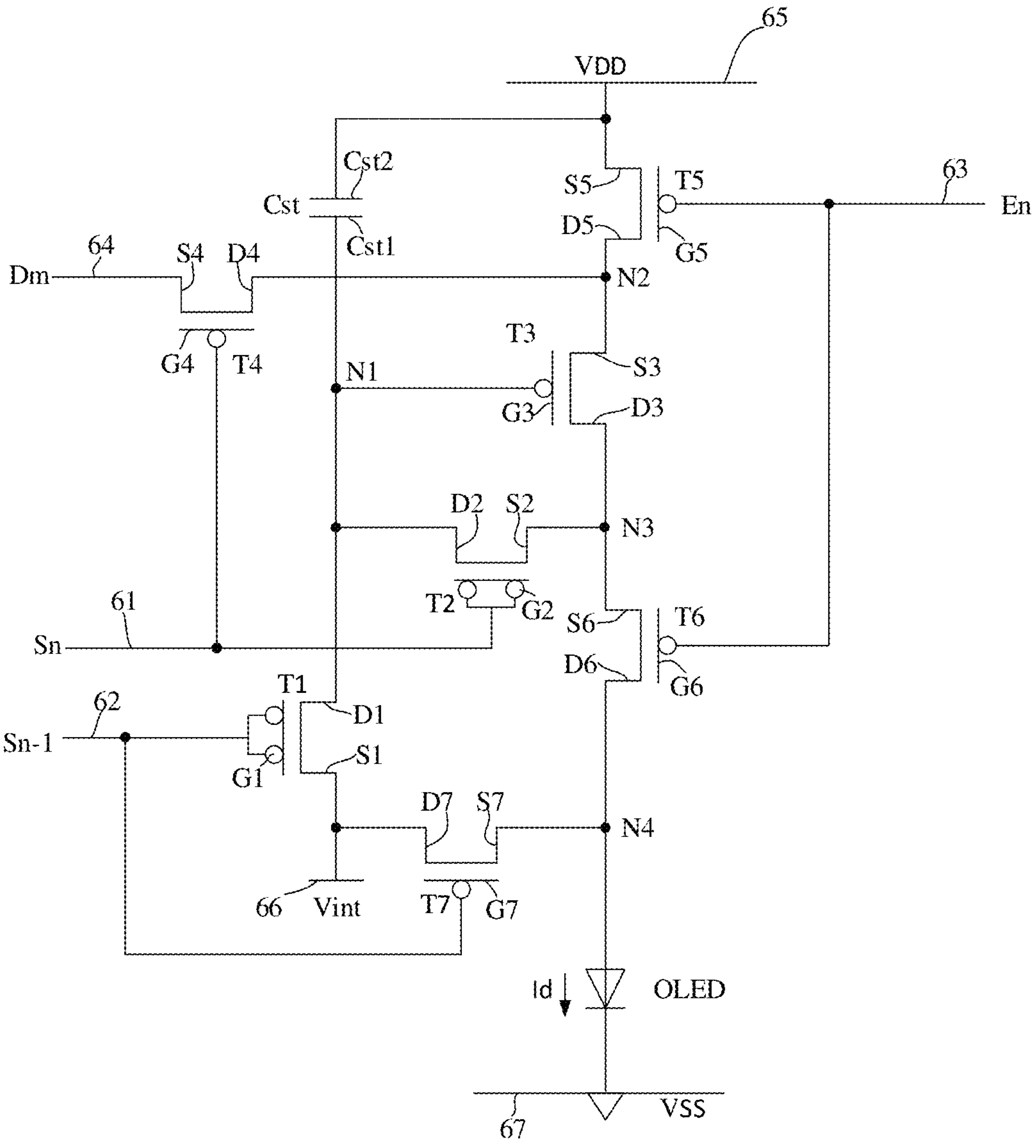
FIG. 6 shows an equivalent circuit diagram of a pixel driving circuit of the display substrate according to some exemplary embodiments of the present disclosure.
Figure 7:
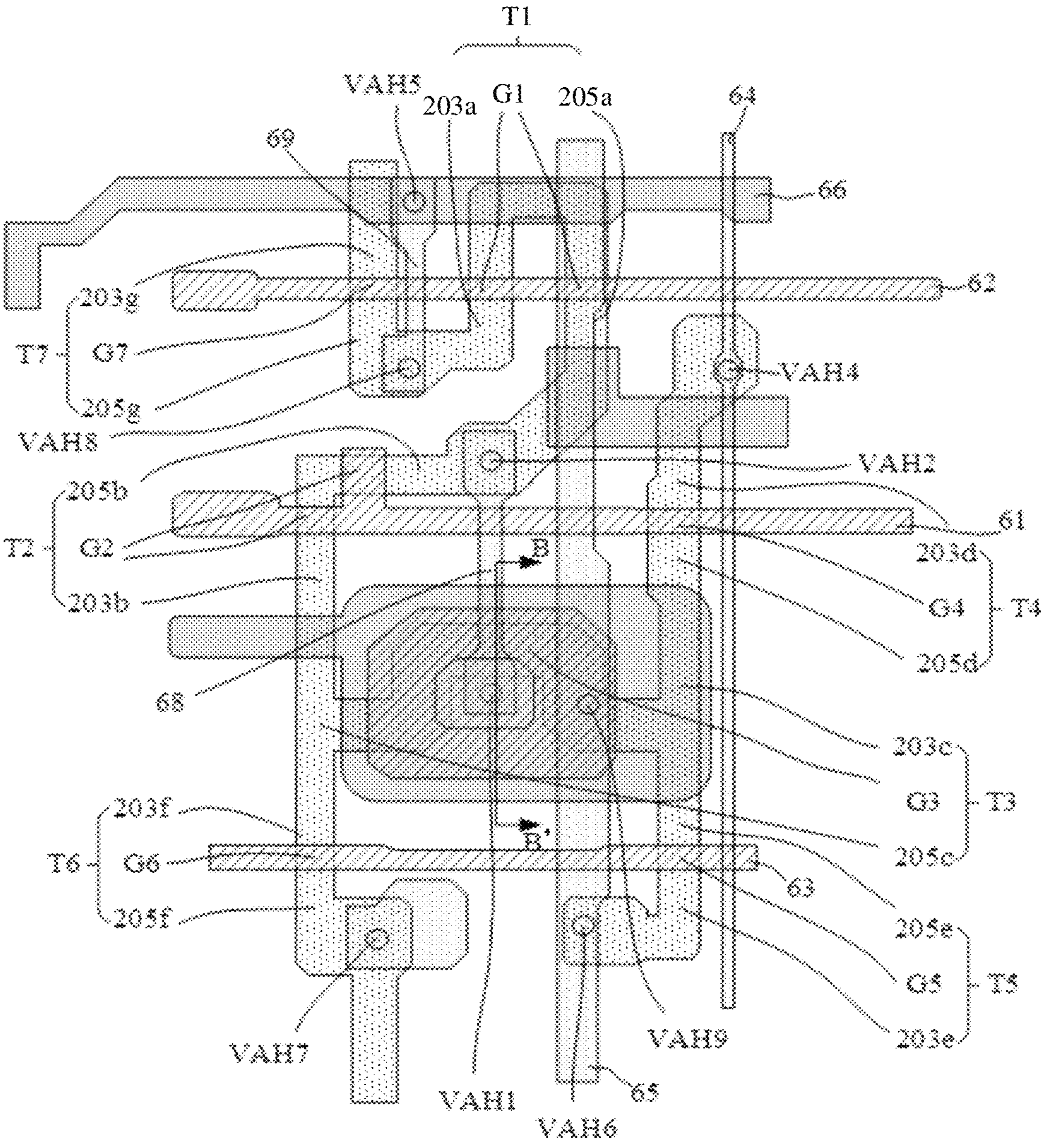
FIG. 7 shows a plan view of an exemplary implementation of a sub-pixel in a first display pixel region of the display substrate according to some exemplary embodiments of the present disclosure.

FIG. 6 shows an equivalent circuit diagram of a pixel driving circuit of the display substrate according to some exemplary embodiments of the present disclosure. FIG. 7 shows a plan view of an exemplary implementation of the sub-pixel in the first display pixel region of the display substrate according to some exemplary embodiments of the present disclosure. FIG. 8 to FIG. 11 show plan views of some film layers of the exemplary implementation of the sub-pixel in FIG. 7. For example, a semiconductor layer, a first conductive layer, a second conductive layer and a third conductive layer are schematically shown in FIG. 8 to FIG. 11, respectively.

Referring to FIG. 6 to FIG. 11 in combination, the pixel driving circuit may include a plurality of thin film transistors and a storage capacitor Cst. The pixel driving circuit is used to drive an organic light emitting diode (OLED). The plurality of thin film transistors may include a first transistor T1, a second transistor T2, a third transistor T3, a fourth transistor T4, a fifth transistor T5, a sixth transistor T6, and a seventh transistor T7. Each transistor may include a gate electrode, a source electrode, and a drain electrode.

The display substrate may further include a plurality of signal lines. For example, the plurality of signal lines may include: a scan signal line 61 for transmitting a scan signal Sn, a reset signal line 62 for transmitting a reset control signal RESET (that is, a scan signal of a previous line), a light emission control line 63 for transmitting a light emission control signal En, a data signal line 64 for transmitting a data signal Dm, a driving voltage line 65 for transmitting a driving voltage VDD, an initialization voltage line 66 for transmitting an initialization voltage Vint, and a power line 67 for transmitting a VSS voltage.

Figure 8:
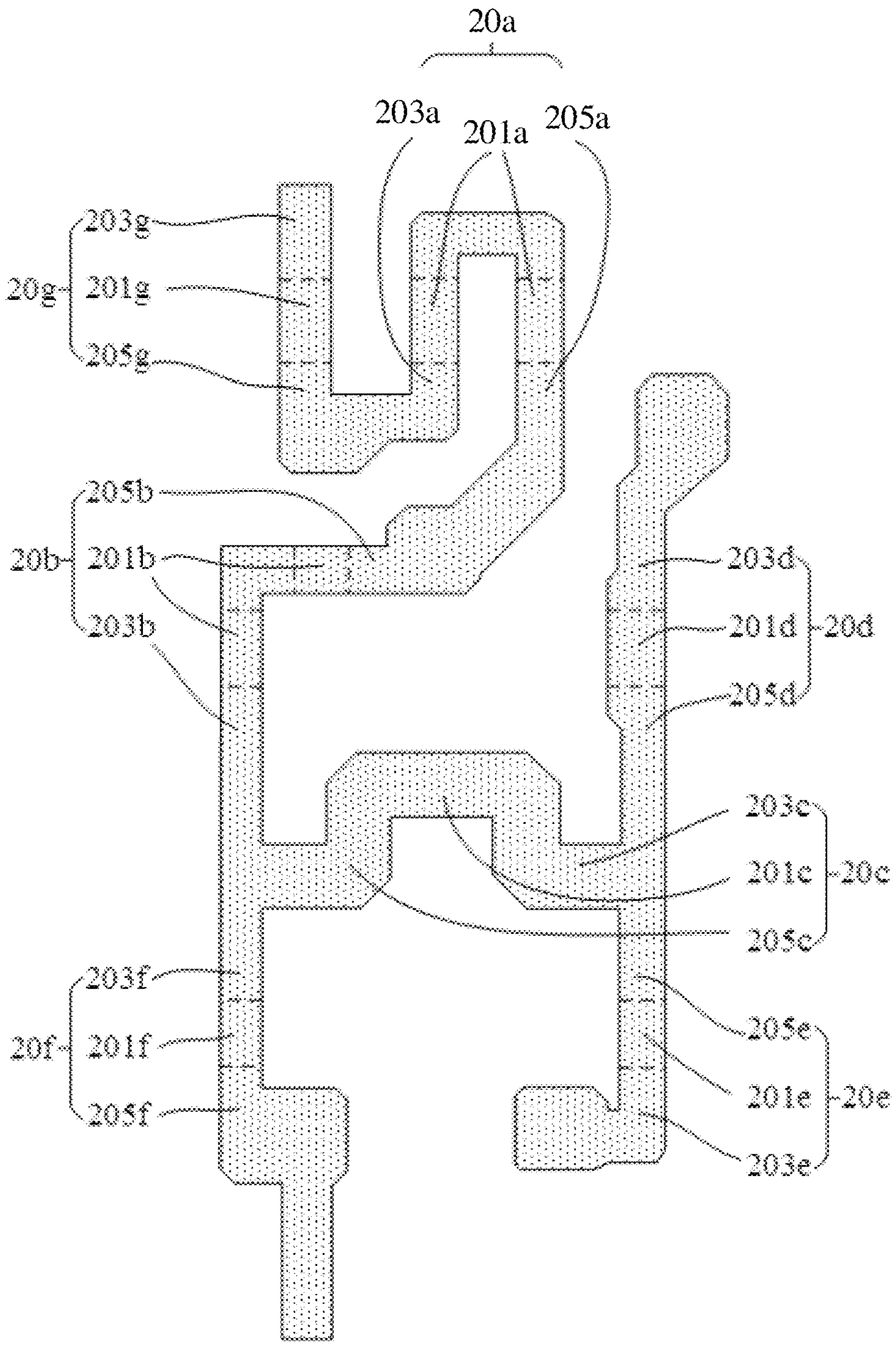
FIG. 8 to FIG. 11 show plan views of some film layers of the exemplary implementation of the sub-pixel in FIG. 7, where a semiconductor layer, a first conductive layer, a second conductive layer and a third conductive layer are schematically shown in FIG. 8 to FIG. 11, respectively.

The first transistor T1, the second transistor T2, the third transistor T3, the fourth transistor T4, the fifth transistor T5, the sixth transistor T6 and the seventh transistor T7 may be formed along an active layer as shown in FIG. 8. The active layer may have a curved or bent shape, and may include a first active layer 20*a* corresponding to the first transistor T1, a second active layer 20*b* corresponding to the second transistor T2, a third active layer 20*c* corresponding to the third transistor T3, a fourth active layer 20*d* corresponding to the fourth transistor T4, a fifth active layer 20*e* corresponding to the fifth transistor T5, a sixth active layer 20*f* corresponding to the sixth transistor T6, and a seventh active layer 20*g* corresponding to the seventh transistor T7.

The active layer may contain, for example, polysilicon, and may include, for example, a channel region, a source region and a drain region. The channel region may be non-doped or have a doping type different from that of the source region and the drain region, and therefore has semiconductor characteristics. The source region and the drain region are respectively located on both sides of the channel region, and are doped with impurities, and therefore have conductivity. The impurities may vary depending on whether the TFT is an N-type transistor or a P-type transistor.

The first transistor T1 may include the first active layer 20*a* and a first gate electrode G1. The first active layer 20*a* may include a first channel region 201, a first source region 203*a* and a first drain region 205*a*. The first transistor T1 has the gate electrode G1 electrically connected to the reset signal line 62, a source electrode Si electrically connected to the initialization voltage line 66, and a drain electrode D1 electrically connected to one terminal Cst1 of the storage capacitor Cst, a drain electrode D2 of the second transistor T2 and the gate electrode G3 of the third transistor T3. As shown in FIG. 6, the drain electrode D1 of the first transistor T1, the terminal Cst1 of the storage capacitor Cst, the drain electrode D2 of the second transistor T2 and the gate electrode G3 of the third transistor T3 are connected at a node N1. The first transistor T1 may be turned on according to the reset control signal RESET transmitted through the reset signal line 62 so as to transmit the initialization voltage Vint to the gate electrode G3 of the third transistor T3, so that an initialization operation is performed to initialize the voltage of the gate electrode G3 of the third transistor T3. That is to say, the first transistor T1 is also referred to as an initialization transistor.

The second transistor T2 includes the second active layer 20*b* and a second gate electrode G2. The second active layer 20*b* may include a second channel region 201*b*, a second source region 203*b*, and a second drain region 205*b*. The second transistor T2 has the gate electrode G2 electrically connected to the scan signal line 61, a source electrode S2 electrically connected to a node N3, and the drain electrode D2 electrically connected to the node N1. The second transistor T2 may be turned on according to the scan signal Sn transmitted through the scan signal line 61 so as to electrically connect the gate electrode G3 and the drain electrode D3 of the third transistor T3, so that a diode connection of the third transistor T3 is achieved.

The third transistor T3 includes the third active layer 20*c* and a third gate electrode G3. The third active layer 20*c* may include a third source region 203*c*, a third drain region 205*c*, and a third channel region 201*c* connecting the third source region 203*c* and the third drain region 205*c*. The third source region 203*c* and the third drain region 205*c* extend in two opposite directions with respect to the third channel region 201*c*. The third source region 203*c* of the third transistor T3 is connected to a fourth drain region 205*d* and a fifth drain region 205*e*. The third drain region 205*c* is connected to the second source region 203*b* and a sixth source region 203*f*. The gate electrode G3 of the third transistor T3 is electrically connected to the node N1 through via holes VAH1 and VAH2 as well as a first connection part 68. The third transistor T3 has the gate electrode G3 electrically connected to the node N1, a source electrode S3 electrically connected to a node N2, and the drain electrode D3 electrically connected to the node N3. The third transistor T3 may receive the data signal Dm according to a switching operation of the fourth transistor T4 so as to supply a driving current Id to the OLED. That is to say, the third transistor T3 is also referred to as a driving transistor.

The fourth transistor T4 includes the fourth active layer 20*d* and a fourth gate electrode G4. The fourth active layer 20*d* may include a fourth channel region 201*d*, a fourth source region 203*d*, and a fourth drain region 205*d*. The fourth transistor T4 is used as a switching device for selecting a target sub-pixel for light emission. The fourth gate electrode G4 is connected to the scan signal line 61, the fourth source region 203*d* is connected to the data signal line 64 through a via hole VAH4, and the fourth drain region 205*d* is connected to the first transistor T1 and the fifth transistor T5, that is, electrically connected to the node N2. The fourth transistor T4 may be turned on according to the scan signal Sn transmitted through the scan signal line 61, so that a switching operation is performed to transmit the data signal Dm to the source electrode S3 of the third transistor T3.

The fifth transistor T5 includes the fifth active layer 20*e* and a fifth gate electrode G5. The fifth active layer 20*e* may include a fifth channel region 201*e*, a fifth source region 203*e*, and a fifth drain region 205*e*. The fifth source region 203*e* may be connected to the driving voltage line 65 through a via hole VAH6. The fifth transistor T5 has a gate electrode G5 electrically connected to the light emission control line 63, a source electrode S5 electrically connected to the driving voltage line 65, and a drain electrode D5 electrically connected to the node N2.

The sixth transistor T6 includes the sixth active layer 20*f* and a sixth gate electrode G6. The sixth active layer 20*f* may include a sixth channel region 201*f*, a sixth source region 203*f*, and a sixth drain region 205*f*. The sixth drain region 205*f* may be connected to the anode electrode of the OLED through a via hole VAH7. The sixth transistor T6 has a gate electrode G6 electrically connected to the light emission control line 63, a source electrode S6 electrically connected to the node N3, and a drain electrode D6 electrically connected to a node N4 (that is, to the anode electrode of the OLED). The fifth transistor T5 and the sixth transistor T6 may be turned on concurrently (for example, simultaneously) according to the light emission control signal En transmitted through the light emission control line 63 so as to transmit the driving voltage VDD to the OLED, thereby allowing the driving current Id to flow into the OLED.

The seventh transistor T7 includes the seventh active layer 20*g* and a seventh gate electrode G7. The seventh active layer 20*g* may include a seventh source region 203*g*, a seventh drain region 205*g*, and a seventh channel region 201*g*. The seventh drain region 205*g* is connected to the first source region 203*a* of the first transistor T1. The seventh drain region 205*g* may be electrically connected to the initialization voltage line 66 through a via hole VAH8, a second connection part 69 and a via hole VAH5. The seventh transistor T7 has a gate electrode G7 electrically connected to the reset signal line 62, a source electrode S7 electrically connected to the node N4, and a drain electrode D7 electrically connected to the initialization voltage line 66.

The storage capacitor Cst has one terminal (hereinafter referred to as a first storage capacitor electrode) Cst1 electrically connected to the node N1, and the other terminal (hereinafter referred to as a second storage capacitor electrode) Cst2 electrically connected to the driving voltage line 65.

The OLED has an anode electrode electrically connected to the node N4, and a cathode electrode electrically connected to the power line 67 to receive the common voltage VSS. Accordingly, the OLED may receive the driving current Id from the third transistor T3 to emit light, so as to display an image.

It should be noted that in FIG. 6, each of the thin film transistors T1, T2, T3, T4, T5, T6 and T7 is a p-channel field effect transistor. However, the embodiments of the present disclosure are not limited thereto. At least some of the thin film transistors T1, T2, T3, T4, T5, T6 and T7 may be n-channel field effect transistors.

In operation, in an initialization stage, the reset control signal RESET having a low level is supplied through the reset signal line 62. Subsequently, the first transistor T1 may be turned on based on the low level of the reset control signal RESET, and the initialization voltage Vint from the initialization voltage line 66 is transmitted to the gate electrode G1 of the third transistor T3 through the first transistor T1. Then, the third transistor T3 is initialized due to the initialization voltage Vint.

In a data programming stage, the scan signal Sn having a low level is supplied through the scan signal line 61. Subsequently, the fourth transistor T4 and the second transistor T2 may be turned on based on the low level of the scan signal Sn. Then, the third transistor T3 is placed in a diode-connected state by the second transistor T2 turned-on and is biased in a forward direction.

Subsequently, a compensation voltage Dm+Vth (for example, Vth is a negative value) obtained by subtracting the threshold voltage Vth of the third transistor T3 from the data signal Dm supplied via the data signal line 64 is applied to the gate electrode G3 of the third transistor T3. Next, the driving voltage VDD and the compensation voltage Dm+Vth are applied to both ends of the storage capacitor Cst, so that an electric charge corresponding to a voltage difference between the ends is stored in the storage capacitor Cst.

In a light emission stage, the light emission control signal En from the light emission control line 63 changes from a high level to a low level. Subsequently, in the light emission stage, the fifth transistor T5 and the sixth transistor T6 may be turned on based on the low level of the light emission control signal En.

Next, a driving current is generated based on a difference between the voltage of the gate electrode G3 of the third transistor T3 and the driving voltage VDD. The driving current Id corresponding to the difference between the driving current and a bypass current is supplied to the OLED through the sixth transistor T6.

In the light emission stage, based on a current-voltage relationship of the third transistor T3, a gate-source voltage of the third transistor T3 is maintained at (Dm+Vth)-VDD due to the storage capacitor Cst. The driving current Id is proportional to $(\text{Dm-VDD})^2$. Therefore, the driving current Id may not be affected by a variation of the threshold voltage Vth of the third transistor T3.

Figure 12:
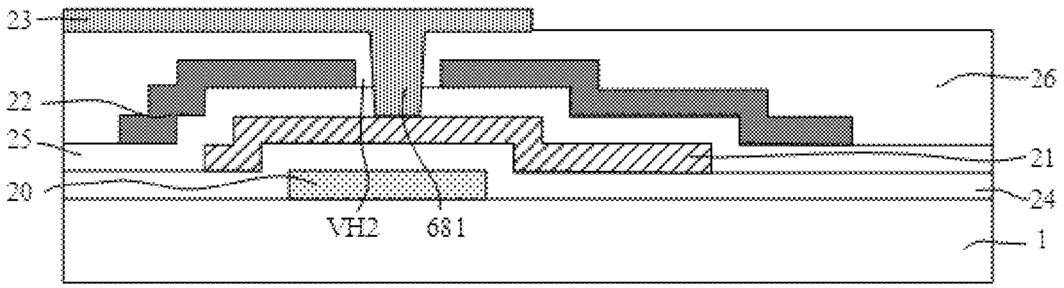
FIG. 12 shows a schematic cross-sectional view of the display substrate according to some exemplary embodiments of the present disclosure taken along line BB' in FIG. 7.

FIG. 12 shows a schematic cross-sectional view of the display substrate according to some exemplary embodiments of the present disclosure taken along line BB' in FIG. 7.

Referring to FIG. 7 to FIG. 12 in combination, the display substrate may include a base substrate 1 and a plurality of film layers arranged on the base substrate 1. In some embodiments, the plurality of film layers include at least a semiconductor layer 20, a first conductive layer 21, a second conductive layer 22, and a third conductive layer 23 that are arranged away from the base substrate 1 in this order. The plurality of film layers may further include at least a plurality of insulating film layers which may include, for example, a first gate insulating layer 24, a second gate insulating layer 25 and an interlayer insulating layer 26. The first gate insulating layer 24 may be arranged between the semiconductor layer 20 and the first conductive layer 21, the second gate insulating layer 25 may be arranged between the first conductive layer 21 and the second conductive layer 22, and the interlayer insulating layer 26 may be arranged between the second conductive layer 22 and the third conductive layer 23.

For example, the semiconductor layer 20 may be formed of a semiconductor material such as low-temperature polysilicon, and may have a thickness in a range of 400 to 800 angstroms, for example, 500 angstroms. The first conductive layer 21 and the second conductive layer 22 may be formed of a conductive material that forms the gate electrode of the thin film transistor and that may be Mo, for example. The first conductive layer 21 and the second conductive layer 22 may have a thickness in a range of 2000 to 4000 angstroms, for example, 3000 angstroms. The third conductive layer 23 may be formed of a conductive material that forms the source electrode and the drain electrode of the thin film transistor and that may contain Ti, Al, etc., for example. The third conductive layer 23 may have a stacked structure formed of Ti/Al/Ti, and have a thickness in a range of 6000 to 9000 angstroms. For example, in a case where the third conductive layer 23 has the stacked structure formed of Ti/Al/Ti, Ti/Al/Ti layers may have a thickness of about 500 angstroms, 6000 angstroms and 500 angstroms, respectively. For example, the first gate insulating layer 24 and the second gate insulating layer 25 may be formed of silicon oxide, silicon nitride, or silicon oxynitride, and each layer may have a thickness of about 1000 to 2000 angstroms. For example, the interlayer insulating layer 26 may be formed of silicon oxide, silicon nitride, or silicon oxynitride, and may have a thickness of about 3000 to 6000 angstroms.

The display substrate includes the scan signal line 61, the reset signal line 62, the light emission control line 63 and the initialization voltage line 66 arranged in a row direction so as to respectively apply the scan signal Sn, the reset control signal RESET, the light emission control signal En and the initialization voltage Vint to the sub-pixels 11, 12 and 13. The display substrate may further include the data signal line 64 and the driving voltage line 65 that cross the scan signal line 61, the reset signal line 62, the light emission control line 63 and the initialization voltage line 66 so as to respectively apply the data signal Dm and the driving voltage VDD to the sub-pixel 10.

Figure 9:
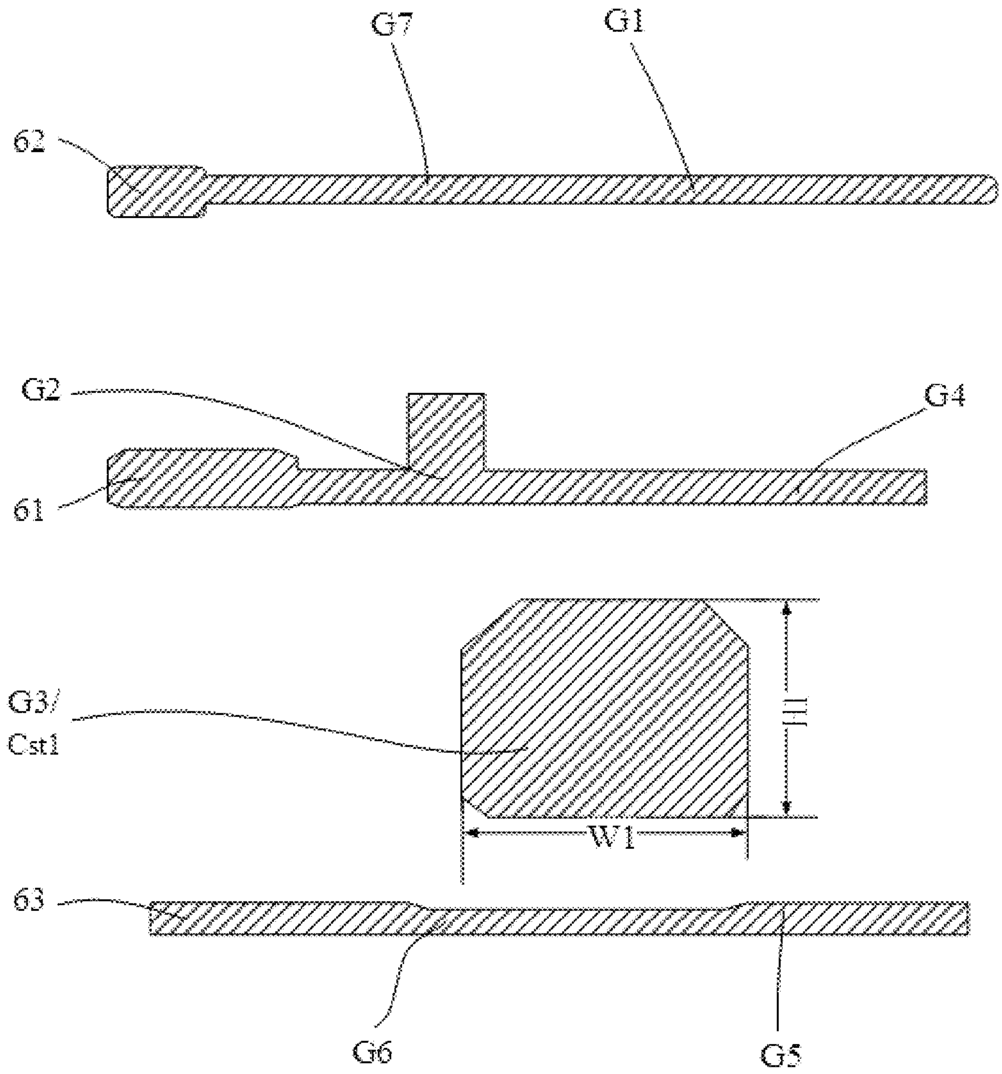

As shown in FIG. 9, the scan signal line 61, the reset signal line 62 and the light emission control line 63 are all located in the first conductive layer 21. The gate electrodes G1 to G7 of the transistors are also located in the first conductive layer 21. For example, a portion of the reset signal line 62 and a portion of the semiconductor layer 20 that overlap each other respectively form the gate electrode G1 of the first transistor T1 and the gate electrode G7 of the seventh transistor T7, a portion of the scan signal line 61 and a portion of the semiconductor layer 20 that overlap each other respectively form the gate electrode G2 of the second transistor T2 and the gate electrode G4 of the fourth transistor T4, and a portion of the light emission control line 63 and a portion of the semiconductor layer 20 that overlap each other respectively form the gate electrode G6 of the sixth transistor T6 and the gate electrode G5 of the fifth transistor T5.

Continuing to refer to FIG. 9, the display substrate may further include a plurality of first storage capacitor electrodes Cst1 located in the first display pixel region DP1. The plurality of first storage capacitor electrodes Cst1 are also located in the first conductive layer 21. A portion of the first storage capacitor electrode Cst1 that overlaps the semiconductor layer 20 forms the third gate electrode G3 of the third transistor T3. The first storage capacitor electrode Cst1 also forms one terminal of the storage capacitor Cst. That is, the first storage capacitor electrode Cst1 simultaneously serves as the gate electrode G3 of the third transistor T3 and one electrode of the storage capacitor Cst.

The first storage capacitor electrode Cst1 has a first size W1 in the first direction X and a second size H1 in the second direction Y. For example, an orthographic projection of the first storage capacitor electrode Cst1 on the base substrate 1 may have a substantially rectangular shape. The "substantially rectangular shape" herein may include a rectangle, a rectangle with at least one rounded corner, and a rectangle with at least one corner chamfered. With reference to FIG. 7, the first size W1 may represent a width of the first storage capacitor electrode Cst1, and the second size H1 may represent a height of the first storage capacitor electrode Cst1.

In some exemplary embodiments, the first size W1 may be in a range of 10 microns to 16 microns, for example, 12 microns to 17 microns, such as about 15 microns. The second size H1 may be in a range of 8 microns to 15 microns, for example, 10 microns to 14 microns, such as about 12 microns.

Figure 10:
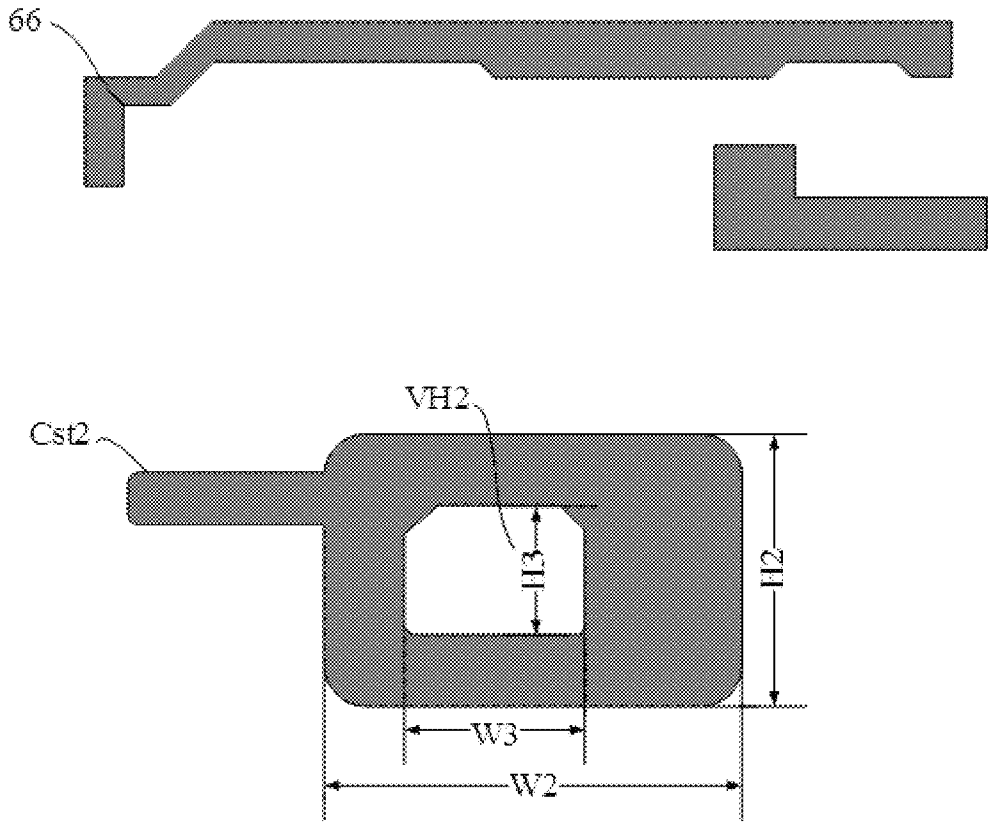

As shown in FIG. 10, the initialization voltage line 66 is located in the second conductive layer 22. The display substrate may further include a plurality of second storage capacitor electrodes Cst2 located in the first display pixel region DP1. The plurality of second storage capacitor electrodes Cst2 are also located in the second conductive layer 22. The plurality of second storage capacitor electrodes Cst2 are respectively arranged corresponding to the plurality of first storage capacitor electrodes Cst1. That is, orthographic projections of the plurality of second storage capacitor electrodes Cst2 on the base substrate 1 at least partially overlap orthographic projections of the corresponding first storage capacitor electrodes Cst1 on the base substrate 1. The second storage capacitor electrode Cst2 forms the other terminal of the storage capacitor Cst. That is, the first storage capacitor electrode Cst1 and the second storage capacitor electrode Cst2 are arranged opposite to each other, the orthographic projections of the two storage capacitor electrodes on the base substrate 1 at least partially overlap each other, and the second gate insulating layer 25 is arranged between the two storage capacitor electrodes. For example, the first storage capacitor electrode Cst1 may be electrically connected to the node N1 through the via holes VAH1 and VAH2 as well as the first connection part 68, and the second storage capacitor electrode Cst2 may be electrically connected to the driving voltage line 65 through a via hole VAH9, that is, the first storage capacitor electrode Cst1 and the second storage capacitor electrode Cst2 are connected to different voltage signals. In this way, an overlapping portion between the first storage capacitor electrode Cst1 and the second storage capacitor electrode Cst2 may form the storage capacitor Cst.

The second storage capacitor electrode Cst2 has a first size W2 in the first direction X and a second size H2 in the second direction Y.

In some exemplary embodiments, the first size W2 may be in a range of 18 microns to 23 microns, for example, 18 microns to 20 microns, such as about 22 microns. The second size H2 may be in a range of 10 microns to 15 microns, for example, 12 microns to 15 microns, such as about 14.5 microns.

Referring to FIG. 7, FIG. 10 and FIG. 12 in combination, the second storage capacitor electrode Cst2 may include the through hole VH2 to facilitate an electrical connection between the first storage capacitor electrode Cst1 located under the second storage capacitor electrode Cst2 and components located in the third conductive layer 23. For example, a portion of the first connection part 68 is formed in the via hole VAH1 to form a conductive plug 681. The conductive plug 681 extends through the through hole VH2 and is electrically connected to the first storage capacitor electrode Cst1. In this way, one end of the first connection part 68 is electrically connected to the terminal Cst1 of the storage capacitor.

The through hole VH2 of the second storage capacitor electrode Cst2 has a first size W3 in the first direction X and a second size H3 in the second direction Y. For example, an orthographic projection of the through hole VH2 on the base substrate 1 may have a substantially rectangular shape. The "substantially rectangular shape" herein may include a rectangle or a square, a rectangle or a square with at least one rounded corner, and a rectangle or a square with at least one corner chamfered. With reference to FIG. 10, the first size W3 may represent a width of the through hole VH2, and the second size H3 may represent a height of the through hole VH2.

In some exemplary embodiments, the first size W3 may be in a range of 5 microns to 10 microns, such as about 7.5 microns. The second size H3 may be in a range of 5 microns to 15 microns, such as about 7.5 microns.

Figure 11:
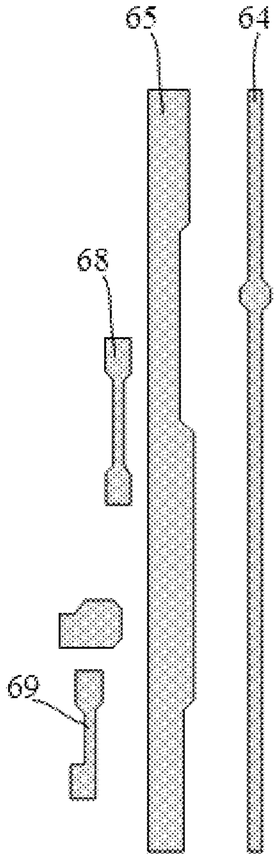

Referring to FIG. 11, the data signal line 64 and the driving voltage line 65 are located in the third conductive layer 23. In addition, the first connection part 68 and a second connection part 69 are also located in the third conductive layer 23.

Referring back to FIG. 1 and FIG. 3, a plurality of sub-pixels are arranged in an array on the base substrate 1, that is, a plurality of rows of sub-pixels and a plurality of columns of sub-pixels are formed on the base substrate 1. In FIG. 1, two rows of sub-pixels respectively electrically connected to scan signal lines 61A and 61B are schematically shown.

For the plurality of rows of sub-pixels, because a plurality of openings are provided on the base substrate 1, each row of sub-pixels include a different number of sub-pixels.

In the embodiments of the present disclosure, a sub-pixel row including a largest number of sub-pixels in the display substrate, such as a sub-pixel row electrically connected to the scan signal line 61A in FIG. 1, may be referred to as a reference sub-pixel row, and the number of the sub-pixels in the reference sub-pixel row is taken as a reference value. A sub-pixel row including a number of sub-pixels less than the reference value, such as a sub-pixel row connected to the scan signal line 61B in FIG. 1, is taken as a compensation sub-pixel row.

For the convenience of description, the scan signal line electrically connected to the compensation sub-pixel row may be referred to as a first scan signal line, and the scan signal line electrically connected to the reference sub-pixel row may be referred to as a second scan signal line. It should be understood that the display substrate may include a plurality of compensation sub-pixel rows and a plurality of reference sub-pixel rows. Accordingly, the display substrate may include a plurality of first scan signal lines and a plurality of second scan signal lines.

The number of the sub-pixels electrically connected to the first scan signal line is less than the number of the sub-pixels electrically connected to the second scan signal line, so that the load on the first scan signal line is less than the load on the second scan signal line. Therefore, it is necessary to perform load compensation on the first scan signal line to make the load on the first scan signal line consistent with the load on the second scan signal line, so that the display difference may be avoided, and the display quality may be ensured.

It should be noted that at least two of the first scan signal lines may be electrically connected to different numbers of sub-pixels, so that the loads on at least two of the first scan signal lines may also be different from each other. Therefore, it is necessary to perform different load compensations on the first scan signal lines to make the loads on the first scan signal lines consistent with one another, so that the display difference may be avoided and the display quality may be ensured.

It should be further noted that the number of the sub-pixels electrically connected to each first scan signal line is related to factors such as the number of the openings, the shape of the openings, and the arrangement of the sub-pixels.

In the embodiments of the present disclosure, a load compensation unit may be provided in the first dummy pixel region DMP1. The load compensation unit may be electrically connected to the first scan signal line to compensate for the load on the first scan signal line.

In the embodiments of the present disclosure, the smaller the number of the sub-pixels in the compensation sub-pixel row, the less the load on the scan signal line for providing the scan signals, and the greater the load that needs to be compensated. Therefore, optionally, in the display substrate provided by the embodiments of the present disclosure, the greater the number of the sub-pixels connected to the scan signal line corresponding to the load compensation unit, the smaller the compensation load value of the load compensation unit. The scan signal lines with different numbers of sub-pixels are compensated by load compensation units with different compensation load values, so that the loads on different scan signal lines are uniform, which avoids the display difference and ensures the display quality.

For example, the reference sub-pixel row includes N sub-pixels, and the compensation sub-pixel row includes M sub-pixels. When compensating for the load on the scan signal line, the value of the load to be compensated may be determined according to a difference between the number of the sub-pixels included in the compensation sub-pixel line to be compensated and the number of the sub-pixels included in the reference sub-pixel line (that is, N-M).

In the embodiments of the present disclosure, the smaller the number of the sub-pixels electrically connected to the first scan signal line, the greater the load that needs to be compensated, and accordingly, the greater the number of the first dummy sub-pixels electrically connected to the first scan signal line. For example, the at least one scan signal line (e.g., the first scan signal line described above) may include a $1^{st}$ scan signal line and a $2^{nd}$ scan signal line. The $1^{st}$ scan signal line is electrically connected to a plurality of sub-pixels and at least one first dummy sub-pixel in a row of sub-pixels, and the $2^{nd}$ scan signal line is electrically connected to a plurality of sub-pixels and at least one first dummy sub-pixel in another row of sub-pixels. The number of the sub-pixels electrically connected to the $1^{st}$ scan signal line is less than the number of the sub-pixels electrically connected to the $2^{nd}$ scan signal line. Accordingly, the number of the first dummy sub-pixels electrically connected to the $1^{st}$ scan signal line is greater than the number of the first dummy sub-pixels electrically connected to the $2^{nd}$ scan signal line.

Referring to FIG. 1 and FIG. 3 in combination, the openings TH1 and TH2 have the largest size at their centers. Accordingly, a row of sub-pixels extending along the centers of the openings TH1 and TH2 has the largest number of missing sub-pixels, and a row of sub-pixels extending along the edges of the openings TH1 and TH2 has a relatively small number of missing sub-pixels. In this way, in the first dummy pixel region DMP1, the plurality of first dummy sub-pixel structures 50 are arranged in the first direction X and the second direction Y, and the number of the first dummy sub-pixel structures in the same row firstly increases and then decreases in the second direction Y. That is, the row of first dummy sub-pixel structures extending along the centers of the openings TH1 and TH2 includes the largest number of first dummy sub-pixel structures, and the number of the first dummy sub-pixel structures in the same row gradually decreases in a direction from the centers of the openings to the edges of the openings.

It should be noted that the expression "center" herein means a geometric center or a centroid of a pattern.

In the embodiments of the present disclosure, the load compensation unit may be formed by designing the first dummy pixel structure 50.

Figure 13:
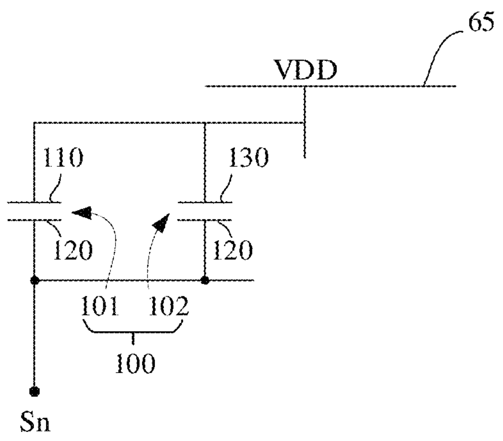
FIG. 13 shows an equivalent circuit diagram of a load compensation unit (that is, a first dummy pixel structure) of the display substrate according to some exemplary embodiments of the present disclosure.
Figure 14:
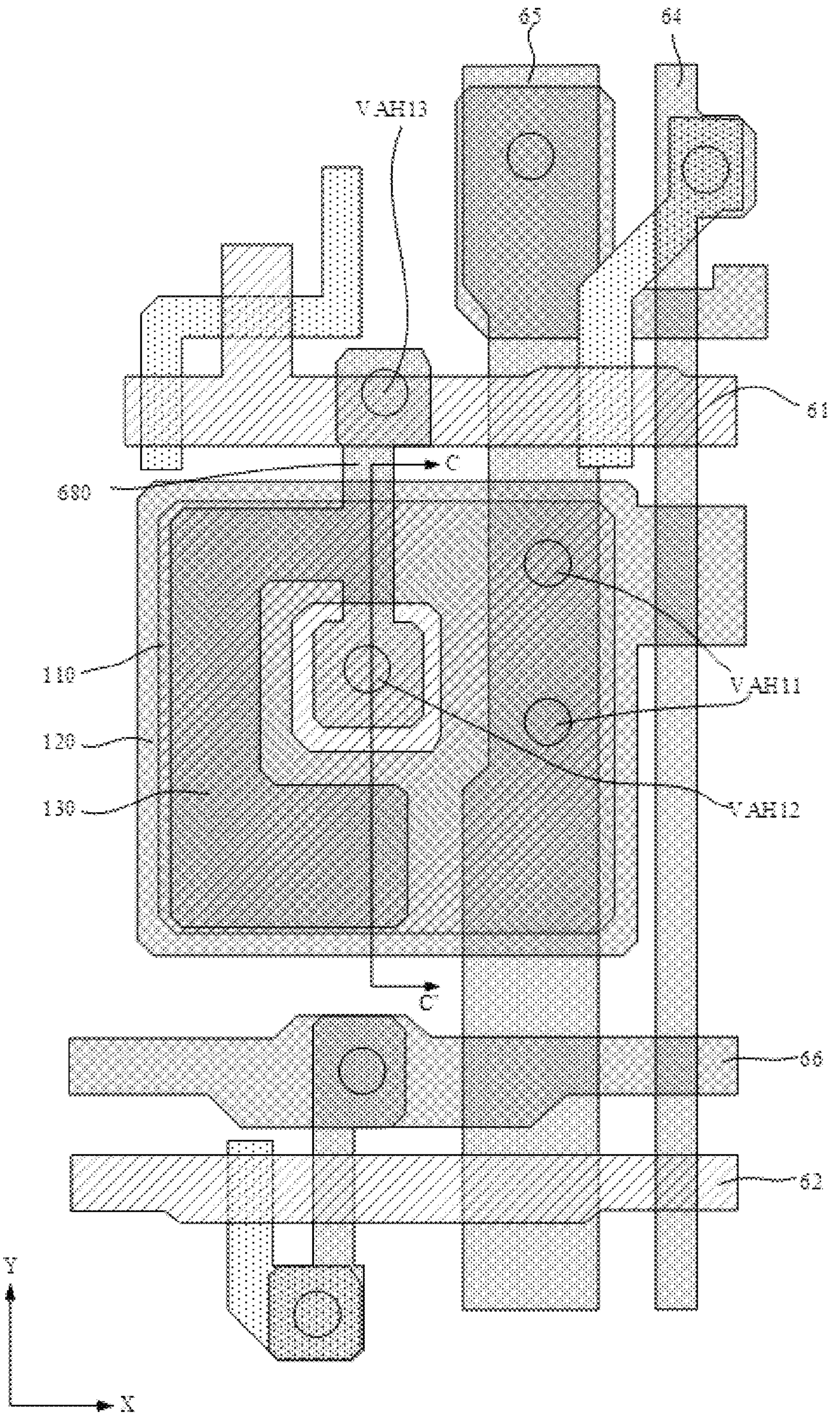
FIG. 14 shows a plan view of an exemplary implementation of a first dummy sub-pixel structure of the display substrate according to some exemplary embodiments of the present disclosure.

FIG. 13 shows an equivalent circuit diagram of a load compensation unit (that is, a first dummy pixel structure) of the display substrate according to some exemplary embodiments of the present disclosure. FIG. 14 shows a plan view of an exemplary implementation of the first dummy sub-pixel structure of the display substrate according to some exemplary embodiments of the present disclosure. FIG. 15 to FIG. 18 show plan views of some film layers of the exemplary implementation of the first dummy sub-pixel structure in FIG. 14. For example, a semiconductor layer, a first conductive layer, a second conductive layer and a third conductive layer located in the first dummy pixel region are schematically shown in FIG. 15 to FIG. 18, respectively.

As described above, the plurality of first dummy pixel structures 50 may include a plurality of first dummy sub-pixel structures 51, 52 and 53 corresponding to the plurality of sub-pixels located in the first display pixel region DP1. Each of the plurality of first dummy sub-pixel structures 51, 52 and 53 may include a compensation capacitor 100.

In the embodiments of the present disclosure, the at least one scan signal line 61 is electrically connected to the pixel driving circuit of each sub-pixel in a row of sub-pixels, and is further electrically connected to the compensation capacitor 100 of the at least one first dummy sub-pixel structure.

For example, the display substrate may further include a first compensation connection part 680, and the compensation capacitor 100 may include a first compensation capacitor electrode 110. The first compensation connection part 680 has one end electrically connected to the first compensation capacitor electrode 110, and the other end electrically connected to the at least one scan signal line 61.

For example, the display substrate may further include a via hole VAH13 exposing a part of the at least one scan signal line, and the other end of the first compensation connection part 680 is electrically connected to the at least one scan signal line 61 through the via hole VAH13.

In the embodiments of the present disclosure, the compensation capacitor is designed in the dummy pixel region and is electrically connected to the scan signal line. In this way, the load on the first scan signal line may be compensated, so that the loads on different scan signal lines may be uniform, which avoids the display difference and ensures the display quality.

In the embodiments of the present disclosure, the storage capacitor Cst of the sub-pixel has a capacitance value less than that of the compensation capacitor 100 of the first dummy sub-pixel structure. With such a design, the load on the first scan signal line may be compensated, so that the loads on different scan signal lines may be uniform, which avoids the display difference and ensures the display quality.

It should be noted that the capacitance value of the storage capacitor Cst of the sub-pixel may also be equal to or greater than that of the compensation capacitor 100 of the first dummy sub-pixel structure. Since one end of the compensation capacitor 100 is electrically connected to the scan signal line, the load on the scan signal line may be compensated to a certain extent by adding the compensation capacitor 100, so that the loads on different scan signal lines may be uniform.

Referring to FIG. 13 to FIG. 18 in combination, the compensation capacitor 100 may include a first compensation capacitor electrode 110 and a second compensation capacitor electrode 120. The first compensation capacitor electrode 110 and the second compensation capacitor electrode 120 are arranged opposite to each other, and orthographic projections of the two capacitor electrodes on the base substrate 1 at least partially overlap each other. In addition, a dielectric layer is provided between the first compensation capacitor electrode 110 and the second compensation capacitor electrode 120. In this way, the compensation capacitor 100 may be formed.

In the embodiments of the present disclosure, an orthographic projection of an overlapping portion between the first compensation capacitor electrode 110 and the second compensation capacitor electrode 120 on the base substrate 1 has an area greater than that of the orthographic projection of the overlapping portion between the first storage capacitor electrode Cst1 and the second storage capacitor electrode Cst2 on the base substrate 1. In this way, the capacitance value of the compensation capacitor 100 of the first dummy sub-pixel structure may be greater than that of the storage capacitor Cst of the sub-pixel, thereby achieving the purpose of compensating for the load on the first scan signal line.

The scan signal line 61 and the reset signal line 62 may extend to the first dummy pixel region DMP1. That is, in the first dummy pixel region DMP1, the scan signal line 61 and the reset signal line 62 are located in the first conductive layer 21. The first compensation capacitor electrode 110 is also located in the first conductive layer 21.

The first compensation capacitor electrode 110 has a first size DW1 in the first direction X and a second size DH1 in the second direction Y. For example, an orthographic projection of the first compensation capacitor electrode 110 on the base substrate 1 may have a substantially rectangular shape. The "substantially rectangular shape" herein may include a rectangle, a square, a rectangle with at least one rounded corner, and a rectangle with at least one corner chamfered. The first size DW1 may represent a width of the first compensation capacitor electrode 110, and the second size DH1 may represent a height of the first compensation capacitor electrode 110.

In the embodiments of the present disclosure, the first storage capacitor electrode Cst1 of the storage capacitor and the first compensation capacitor electrode 110 of the compensation capacitor are both located in the first conductive layer 21. The orthographic projection of the first compensation capacitor electrode 110 of the compensation capacitor on the base substrate 1 has an area greater than that of the orthographic projection of the first storage capacitor electrode Cst1 of the storage capacitor on the base substrate 1.

For example, the first size DW1 of the orthographic projection of the first compensation capacitor electrode 110 on the base substrate 1 in the first direction X is greater than the first size DW1 of the orthographic projection of the first storage capacitor electrode Cst1 on the base substrate 1 in the first direction X. The second size DH1 of the orthographic projection of the first compensation capacitor electrode 110 on the base substrate 1 in the second direction Y is greater than the second size H1 of the orthographic projection of the first storage capacitor electrode Cst1 on the base substrate 1 in the second direction Y.

In some exemplary embodiments, the first size DW1 may be in a range of 16 microns to 30 microns, for example, 20 microns to 25 microns, such as about 22 microns. The second size DH1 may be in a range of 16 microns to 30 microns, for example, 20 microns to 25 microns, such as about 20.5 microns.

The initialization voltage line 66 may extend to the first dummy pixel region DMP1. That is, in the first dummy pixel region DMP1, the initialization voltage line 66 is located in the second conductive layer 22. The second compensation capacitor electrode 120 is also located in the second conductive layer 22.

The second compensation capacitor electrode 120 has a first size DW2 in the first direction X and a second size DH2 in the second direction Y. For example, an orthographic projection of a body of the second compensation capacitor electrode 120 on the base substrate 1 may have a substantially rectangular shape. The "substantially rectangular shape" herein may include a rectangle, a square, a rectangle with at least one rounded corner, and a rectangle with at least one corner chamfered. The first size DW2 may represent a width of the rectangle, and the second size DH2 may represent a height of the rectangle.

In the embodiments of the present disclosure, the second storage capacitor electrode Cst2 of the storage capacitor and the second compensation capacitor electrode 120 of the compensation capacitor are both located in the second conductive layer 22. The orthographic projection of the second compensation capacitor electrode 120 of the compensation capacitor on the base substrate 1 has an area greater than that of the orthographic projection of the second storage capacitor electrode Cst2 of the storage capacitor on the base substrate 1.

For example, the first size DW2 of the orthographic projection of the second compensation capacitor electrode 120 on the base substrate 1 in the first direction X is greater than the first size W2 of the orthographic projection of the second storage capacitor electrode Cst2 on the base substrate 1 in the first direction X. The second size DH2 of the orthographic projection of the second compensation capacitor electrode 120 on the base substrate 1 in the second direction Y is greater than the second size H2 of the orthographic projection of the second storage capacitor electrode Cst2 on the base substrate 1 in the second direction Y.

In some exemplary embodiments, the first size DW2 may be in a range of 23 microns to 30 microns, for example, 22 microns to 25 microns, such as about 24 microns. The second size DH2 may be in a range of 22 microns to 30 microns, for example, 22 microns to 25 microns, such as about 22.5 microns.

The second compensation capacitor electrode 120 may include a through hole VH1 to facilitate an electrical connection between the first compensation capacitor electrode 110 located under the second compensation capacitor electrode 120 and components located in the third conductive layer 23.

The through hole VH1 of the second compensation capacitor electrode 120 has a first size DW3 in the first direction X and a second size DH3 in the second direction Y. For example, an orthographic projection of the through hole VH1 on the base substrate 1 may have a substantially rectangular shape. The "substantially rectangular shape" herein may include a rectangle or a square, a rectangle or a square with at least one rounded corner, and a rectangle or a square with at least one corner chamfered. The first size DW3 may represent a width of the through hole VH1, and the second size DH3 may represent a height of the through hole VH1.

In the embodiments of the present disclosure, the orthographic projection of the through hole VH1 of the second compensation capacitor electrode 120 on the base substrate 1 has an area greater than that of the orthographic projection of the through hole VH2 of the second storage capacitor electrode Cst2 on the base substrate 1.

For example, the first size DW3 of the orthographic projection of the through hole VH1 on the base substrate 1 in the first direction X is less than the first size W3 of the orthographic projection of the through hole VH2 on the base substrate 1 in the first direction X. The second size DH3 of the orthographic projection of the through hole VH1 on the base substrate 1 in the second direction Y is less than the second size H3 of the orthographic projection of the through hole VH2 on the base substrate 1 in the second direction Y.

In some exemplary embodiments, the first size DW3 may be in a range of 5 microns to 10 microns, such as about 7 microns. The second size DH3 may be in a range of 5 microns to 10 microns, such as about 7 microns.

The data signal line 64 and the driving voltage line 65 may extend to the first dummy pixel region DMP1. That is, in the first dummy pixel region DMP1, the data signal line 64 and the driving voltage line 65 are located in the third conductive layer 23.

The compensation capacitor 100 may further include a third compensation capacitor electrode 130. The third compensation capacitor electrode 130 is located in the third conductive layer 23.

An orthographic projection of the third compensation capacitor electrode 130 on the base substrate 1 at least partially overlaps the orthographic projection of the second compensation capacitor electrode 120 on the base substrate 1.

Figure 18:
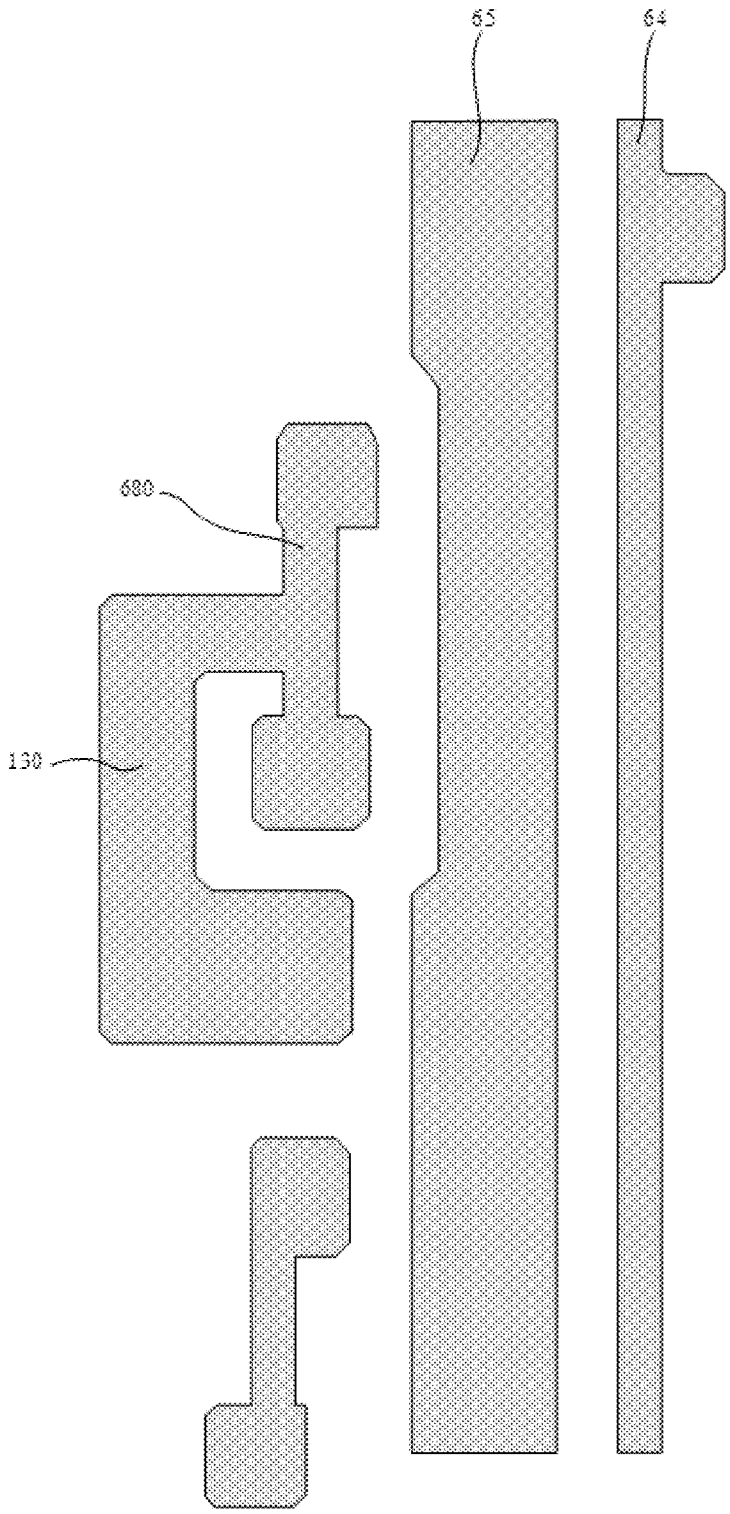
Figure 19:
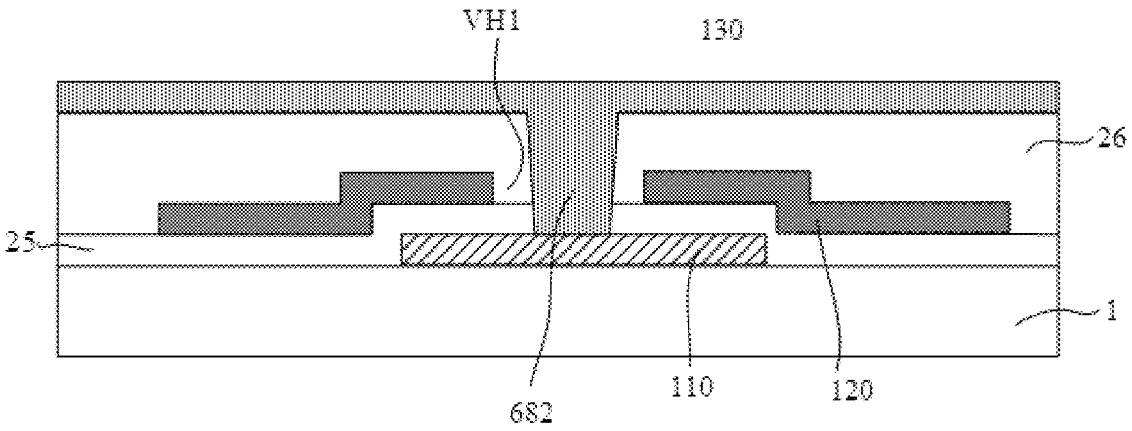
FIG. 19 shows a cross-sectional view of the display substrate according to some exemplary embodiments of the present disclosure taken along line CC' in FIG. 14.

FIG. 19 shows a cross-sectional view of the display substrate according to some exemplary embodiments of the present disclosure taken along line CC' in FIG. 14. Referring to FIG. 14, FIG. 18 and FIG. 19 in combination, any two of the orthographic projection of the first compensation capacitor electrode 110, the orthographic projection of the second compensation capacitor electrode 120 and the orthographic projection of the third compensation capacitor electrode 130 at least partially overlap one another.

A second gate insulating layer 25 is provided between the first compensation capacitor electrode 110 located in the first conductive layer 21 and the second compensation capacitor electrode 120 located in the second conductive layer 22. An interlayer insulating layer 26 is provided between the second compensation capacitor electrode 120 located in the second conductive layer 22 and the third compensation capacitor electrode 130 located in the third conductive layer 23.

The first compensation capacitor electrode 110 and the third compensation capacitor electrode 130 may be electrically connected to the scan signal Sn, and the second compensation capacitor electrode 120 may be electrically connected to the driving voltage VDD. That is, the first compensation capacitor electrode 110 and the third compensation capacitor electrode 130 are supplied with the same voltage signal, and the second compensation capacitor electrode 120 is supplied with another voltage signal. In this way, capacitances may be formed between the first compensation capacitor electrode 110 and the second compensation capacitor electrode 120 as well as between the second compensation capacitor electrode 120 and the third compensation capacitor electrode 130, respectively.

In the embodiments of the present disclosure, referring to FIG. 13 and FIG. 14 in combination, the compensation capacitor 100 may include a first compensation sub-capacitor 101 and a second compensation sub-capacitor 102. For example, the first compensation sub-capacitor 101 and the second compensation sub-capacitor 102 are connected in parallel to form the compensation capacitor 100. Through such an arrangement, the capacitance value of the compensation capacitor 100 may be increased, so that the capacitance value of the compensation capacitor 100 may be greater than that of the storage capacitor Cst, so as to achieve the purpose of compensating for the load.

For example, the first compensation capacitor electrode 110 and the second compensation capacitor electrode 120 are arranged opposite to each other, and orthographic projections of the two on the base substrate 1 at least partially overlap each other to form the first compensation sub-capacitor 101. The third compensation capacitor electrode 130 and the second compensation capacitor electrode 120 are arranged opposite to each other, and orthographic projections of the two on the base substrate 1 at least partially overlap each other to form the second compensation sub-capacitor 102.

Referring to FIG. 14, the driving voltage line 65 is electrically connected to the second compensation capacitor electrode 120 through a via hole VAH11. In this way, the driving voltage VDD may be supplied to the second compensation capacitor electrode 120.

For example, the driving voltage line 65 may be electrically connected to the second compensation capacitor electrode 120 through more than two via holes VAH11. The two or more via holes VAH11 are arranged at intervals in the second direction Y. In this way, a contact resistance between the driving voltage line and the second compensation capacitor electrode may be reduced.

The display panel may further include a first compensation connection part 680. The third compensation capacitor electrode 130 and the first compensation connection part 680 are both located in the third conductive layer 23. The third compensation capacitor electrode 130 and the first compensation connection part 680 may be connected to each other, and they may form a continuously extending integral structure.

One end of the first compensation connection part 680 is formed in a via hole VAH12 to form a conductive plug 682. The conductive plug 682 may extend through the through hole VH1 and is electrically connected to the first compensation capacitor electrode 110. In this way, the first compensation capacitor electrode 110 and the third compensation capacitor electrode 130 may be electrically connected to each other.

The other end of the first compensation connection part 680 may be electrically connected to the scan signal line 61 through the via hole VAH13. In this way, the scan signal Sn may be supplied to the first compensation capacitor electrode 110 and the third compensation capacitor electrode 130.

Figure 15:
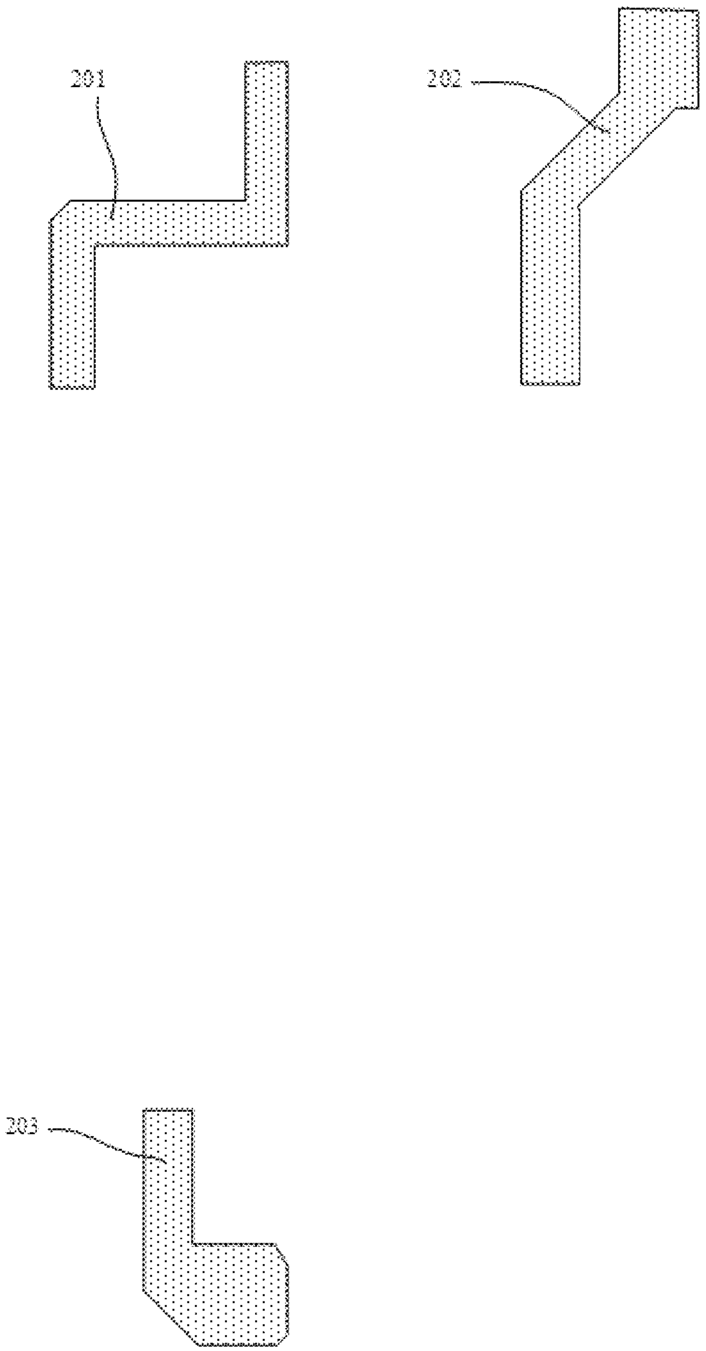
FIG. 15 to FIG. 18 show plan views of some film layers of the exemplary implementation of the first dummy sub-pixel structure in FIG. 14, where a semiconductor layer, a first conductive layer, a second conductive layer and a third conductive layer located in a first dummy pixel region are schematically shown in FIG. 15 to FIG. 18, respectively.
Figure 16:
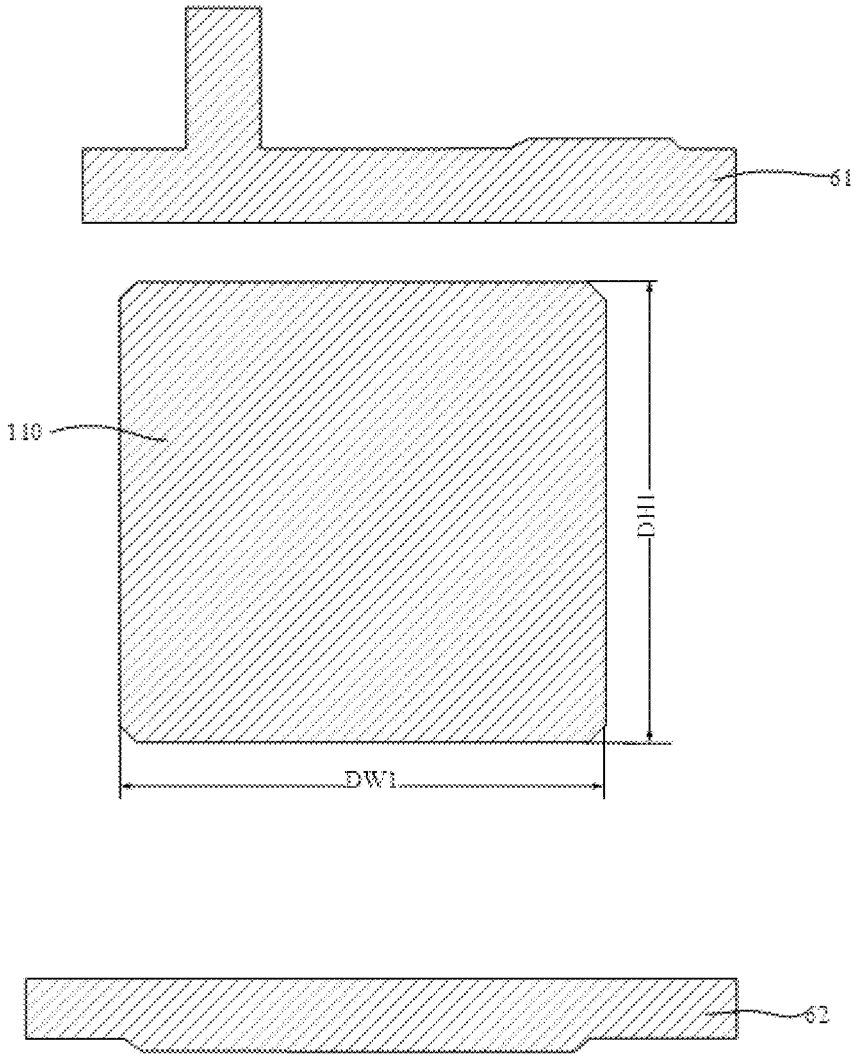
Figure 17:
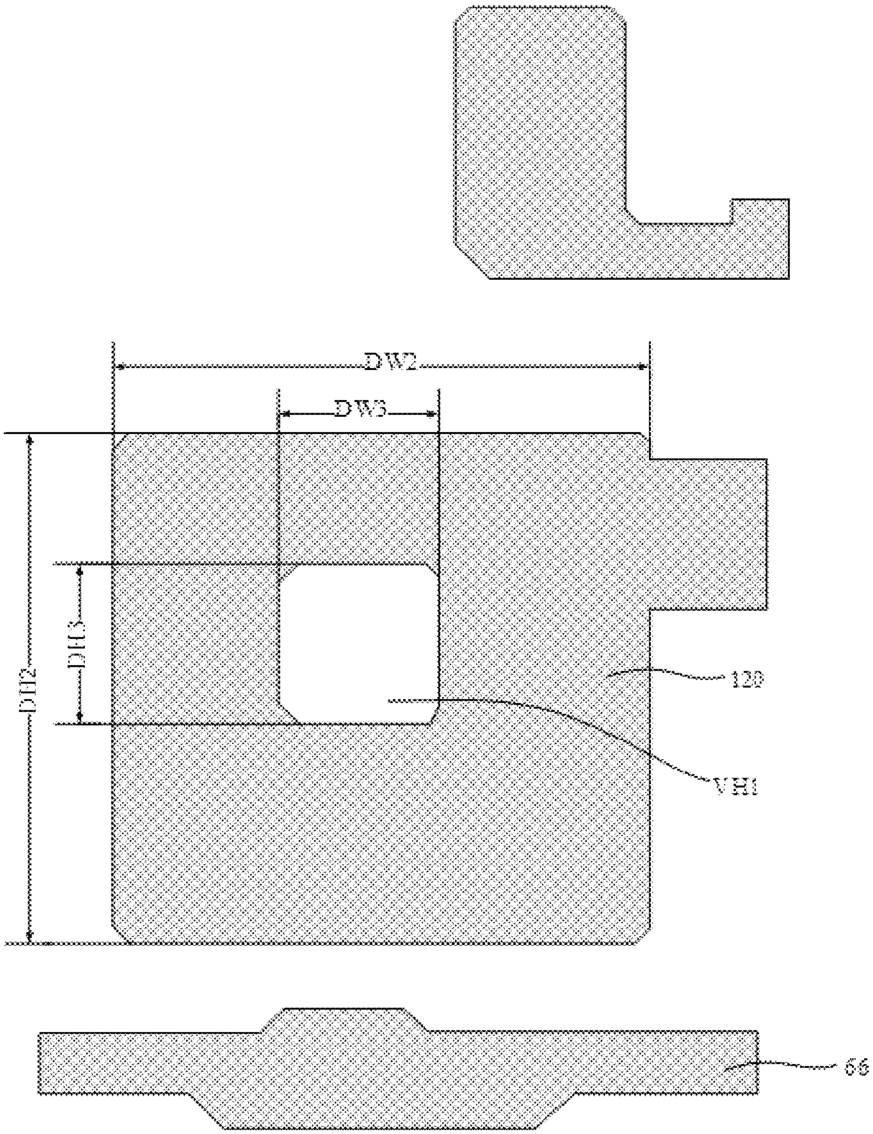

It should be noted that, referring to FIG. 15, in the first dummy pixel region DMP1, the semiconductor layer 20 further includes a first semiconductor part 201, a second semiconductor part 202, and a third semiconductor part 203. Because these semiconductor parts are reserved, when the scan signal line 61 and the reset signal line 62 extend through the display pixel region and the dummy pixel region, the same semiconductor parts arranged under the scan signal line 61 and the reset signal line 62 may ensure the uniformity of operating conditions of the scan signal line 61 and the reset signal line 62 in different regions.

It should be further noted that in the embodiments of the present disclosure, the orthographic projection of the compensation capacitor 100 on the base substrate 1 does not overlap the orthographic projection of the semiconductor layer 20 on the base substrate 1. That is, each of the orthographic projection of the first compensation capacitor electrode 110 on the base substrate 1, the orthographic projection of the second compensation capacitor electrode 120 on the base substrate 1 and the orthographic projection of the third compensation capacitor electrode 130 on the base substrate 1 does not overlap the orthographic projection of the semiconductor layer 20 on the base substrate 1. In this way, no semiconductor part is arranged under the compensation capacitor 100 to avoid interference, which is beneficial for the compensation capacitor 100 to perform a compensation function stably.

Referring back to FIG. 3 to FIG. 5, the dummy pixel region may further include a plurality of second dummy pixel regions DMP2 that may be located between the first dummy pixel region DMP1 and the opening. For example, in the embodiment shown in FIG. 3, four second dummy pixel regions DMP2 may be provided between the first dummy pixel region DMP1 and the two openings.

A plurality of second dummy pixel structures 80 may be provided in the second dummy pixel region DMP2. The plurality of second dummy pixel structures 80 may be arranged on the base substrate 1 in an array in the first direction X and the second direction Y. The plurality of second dummy pixel structures 80 may include a plurality of second dummy sub-pixel structures 81, 82 and 83 corresponding to the plurality of sub-pixels located in the first display pixel region DP1. It should be noted that in the embodiments of the present disclosure, the dummy sub-pixel structures do not emit light. They are denoted as 81, 82 and 83 only in order to correspond to the plurality of sub-pixels 11, 12 and 13 described above, but the embodiments of the present disclosure are not limited thereto.

Figure 20:
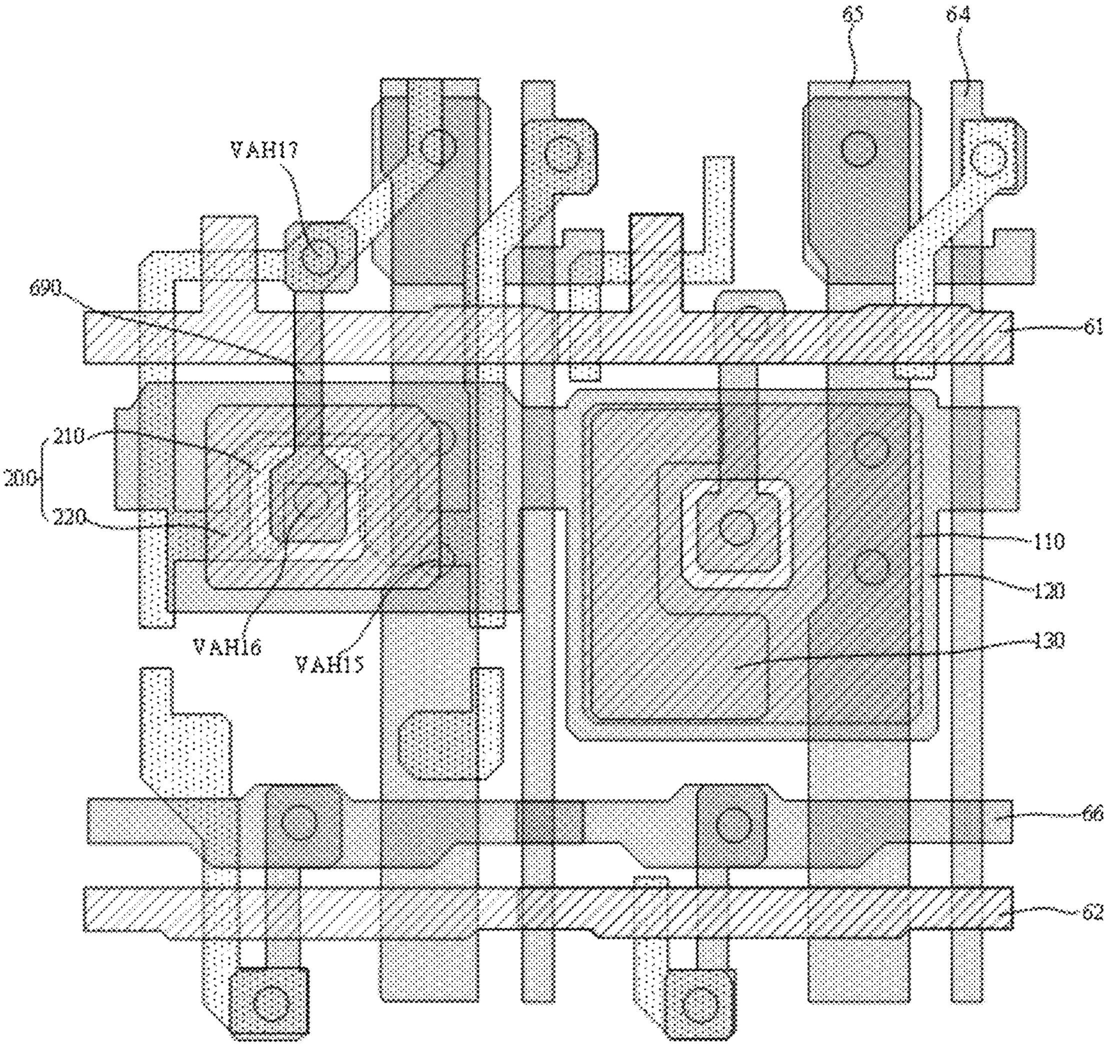
FIG. 20 shows a plan view of an exemplary implementation of a first dummy sub-pixel structure and a second dummy sub-pixel structure of the display substrate according to some exemplary embodiments of the present disclosure.

FIG. 20 shows a plan view of an exemplary implementation of the first dummy sub-pixel structure and the second dummy sub-pixel structure of the display substrate according to some exemplary embodiments of the present disclosure. FIG. 21 to FIG. 24 show plan views of some film layers of the exemplary implementation of the first dummy sub-pixel structure and the second dummy sub-pixel structure in FIG. 20. For example, the semiconductor layer, the first conductive layer, the second conductive layer and the third conductive layer located in the first dummy pixel region and the second dummy pixel region are schematically shown in FIG. 21 to FIG. 24, respectively.

Each of the plurality of second dummy sub-pixel structures 81, 82 and 83 may include a dummy capacitor 200. For example, the dummy capacitor 200 may have a capacitance value substantially equal to that of the storage capacitor Cst.

Referring to FIG. 20 to FIG. 24 in combination, the dummy capacitor 200 may include a first dummy capacitor electrode 210 and a second dummy capacitor electrode 220. The first dummy capacitor electrode 210 and the second dummy capacitor electrode 220 are arranged opposite to each other, and orthographic projections of the two dummy capacitor electrodes on the base substrate 1 at least partially overlap each other. In addition, a dielectric layer is provided between the first dummy capacitor electrode 210 and the second dummy capacitor electrode 220. In this way, the dummy capacitor 200 may be formed.

In the embodiments of the present disclosure, an orthographic projection of an overlapping portion between the first dummy capacitor electrode 210 and the second dummy capacitor electrode 220 on the base substrate 1 has an area substantially equal to that of the orthographic projection of the overlapping portion between the first storage capacitor electrode Cst1 and the second storage capacitor electrode Cst2 on the base substrate 1.

Figure 22:
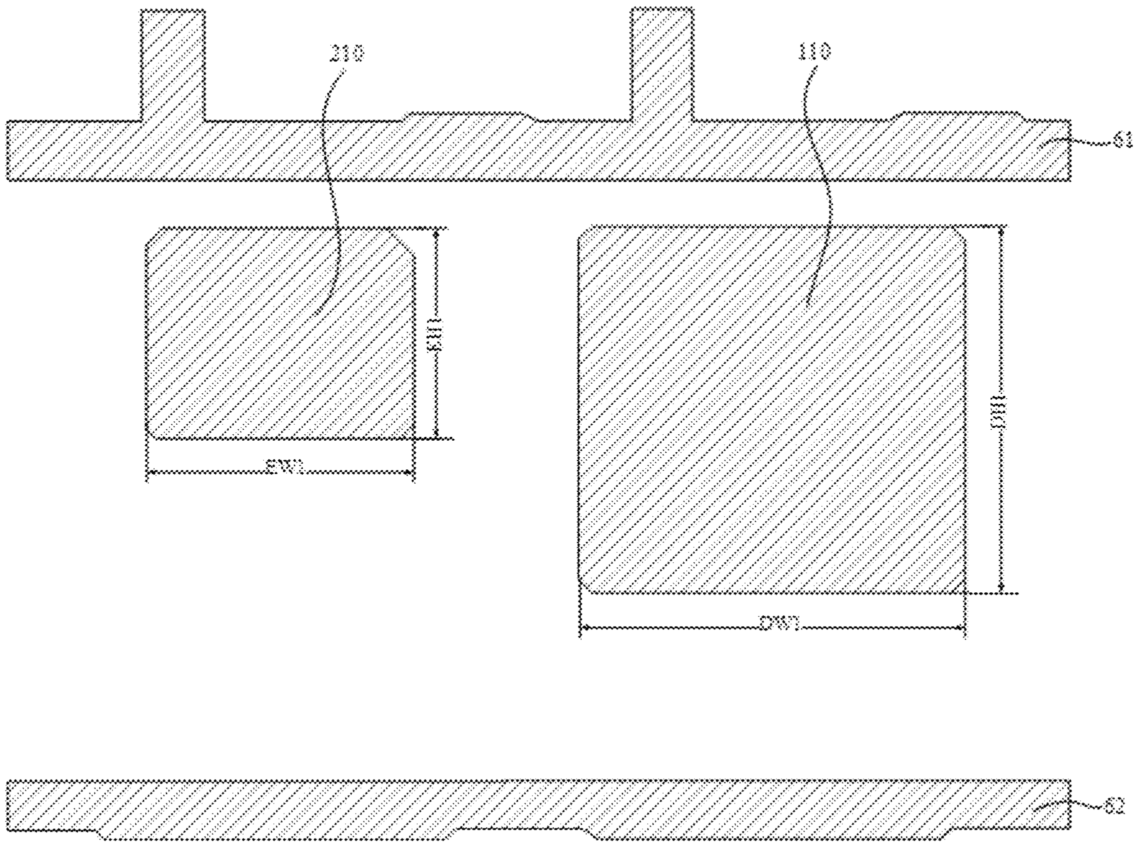

As shown in FIG. 22, the scan signal line 61 and the reset signal line 62 may extend to the second dummy pixel region DMP2. That is, in the second dummy pixel region DMP2, the scan signal line 61 and the reset signal line 62 are located in the first conductive layer 21. The first dummy capacitor electrode 210 is also located in the first conductive layer 21.

The first dummy capacitor electrode 210 has a first size EW1 in the first direction X and a second size EH1 in the second direction Y. For example, an orthographic projection of the first dummy capacitor electrode 210 on the base substrate 1 may have a substantially rectangular shape. The "substantially rectangular shape" herein may include a rectangle, a square, a rectangle with at least one rounded corner, and a rectangle with at least one corner chamfered. With reference to FIG. 22, the first size EW1 may represent a width of the first dummy capacitor electrode 210, and the second size EH1 may represent a height of the first dummy capacitor electrode 210.

In the embodiments of the present disclosure, the first storage capacitor electrode Cst1 of the storage capacitor and the first dummy capacitor electrode 210 of the dummy capacitor are both located in the first conductive layer 21. The orthographic projection of the first dummy capacitor electrode 110 of the dummy capacitor on the base substrate 1 has an area substantially equal to that of the orthographic projection of the first storage capacitor electrode Cst1 of the storage capacitor on the base substrate 1.

For example, the first size EW1 of the orthographic projection of the first dummy capacitor electrode 210 on the base substrate 1 in the first direction X is substantially equal to the first size W1 of the orthographic projection of the first storage capacitor electrode Cst1 on the base substrate 1 in the first direction X. The second size EH1 of the orthographic projection of the first dummy capacitor electrode 210 on the base substrate 1 in the second direction Y is substantially equal to the second size H1 of the orthographic projection of the first storage capacitor electrode Cst1 on the base substrate 1 in the second direction Y.

In some exemplary embodiments, the first size EW1 may be in a range of 16 microns to 30 microns, for example, 20 microns to 25 microns, such as about 22 microns. The second size EH1 may be in a range of 16 microns to 30 microns, for example, 20 microns to 25 microns, such as about 20.5 microns.

Figure 23:
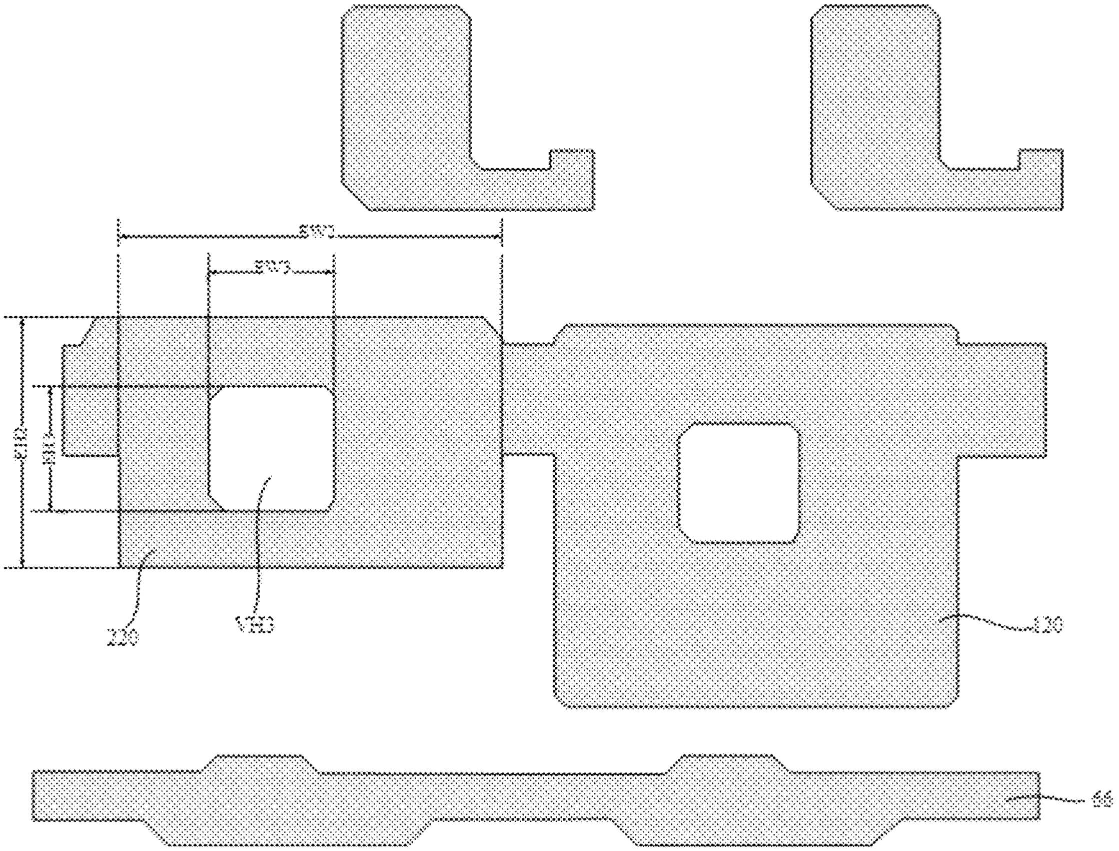

As shown in FIG. 23, the initialization voltage line 66 may extend to the second dummy pixel region DMP2. That is, in the second dummy pixel region DMP2, the initialization voltage line 66 is located in the second conductive layer 22. The second dummy capacitor electrode 220 is also located in the second conductive layer 22.

The second dummy capacitor electrode 220 has a first size EW2 in the first direction X and a second size EH2 in the second direction Y. For example, an orthographic projection of a body of the second dummy capacitor electrode 220 on the base substrate 1 may have a substantially rectangular shape. The "substantially rectangular shape" herein may include a rectangle, a square, a rectangle with at least one rounded corner, and a rectangle with at least one corner chamfered. With reference to FIG. 23, the first size EW2 may represent a width of the rectangle, and the second size EH2 may represent a height of the rectangle.

In the embodiments of the present disclosure, the second storage capacitor electrode Cst2 of the storage capacitor and the second dummy capacitor electrode 220 of the compensation capacitor are both located in the second conductive layer 22. The orthographic projection of the second dummy capacitor electrode 220 of the dummy capacitor on the base substrate 1 has an area substantially equal to that of the orthographic projection of the second storage capacitor electrode Cst2 of the storage capacitor on the base substrate 1.

For example, the first size EW2 of the orthographic projection of the second dummy capacitor electrode 220 on the base substrate 1 in the first direction X is substantially equal to the first size W2 of the orthographic projection of the second storage capacitor electrode Cst2 on the base substrate 1 in the first direction X. The second size EH2 of the orthographic projection of the second dummy capacitor electrode 220 on the base substrate 1 in the second direction Y is substantially equal to the second size H2 of the orthographic projection of the second storage capacitor electrode Cst2 on the base substrate 1 in the second direction Y.

In some exemplary embodiments, the first size EW2 may be in a range of 23 microns to 30 microns, for example, 22 microns to 25 microns, such as about 24 microns. The second size EH2 may be in a range of 22 microns to 30 microns, for example, 22 microns to 25 microns, such as about 22.5 microns.

The second dummy capacitor electrode 220 may include a through hole VH3 to facilitate an electrical connection between the first dummy capacitor electrode 210 located under the second dummy capacitor electrode 220 and components located in the third conductive layer 23.

The through hole VH3 of the second dummy capacitor electrode 220 has a first size EW3 in the first direction X and a second size EH3 in the second direction Y. For example, an orthographic projection of the through hole VH3 on the base substrate 1 may have a substantially rectangular shape. The "substantially rectangular shape" herein may include a rectangle or a square, a rectangle or a square with at least one rounded corner, and a rectangle or a square with at least one corner chamfered. With reference to FIG. 23, the first size EW3 may represent a width of the through hole VH3, and the second size EH3 may represent a height of the through hole VH3.

In the embodiments of the present disclosure, the orthographic projection of the through hole VH3 of the second dummy capacitor electrode 220 on the base substrate 1 has an area substantially equal to that of the orthographic projection of the through hole VH2 of the second storage capacitor electrode Cst2 on the base substrate 1.

For example, the first size EW3 of the orthographic projection of the through hole VH3 on the base substrate 1 in the first direction X is substantially equal to the first size W3 of the orthographic projection of the through hole VH2 on the base substrate 1 in the first direction X. The second size EH3 of the orthographic projection of the through hole VH3 on the base substrate 1 in the second direction Y is substantially equal to the second size H3 of the orthographic projection of the through hole VH2 on the base substrate 1 in the second direction Y.

In some exemplary embodiments, the first size EW3 may be in a range of 5 microns to 10 microns, such as about 7.5 microns. The second size EH3 may in a range of 5 microns to 15 microns, such as about 7.5 microns.

Figure 24:
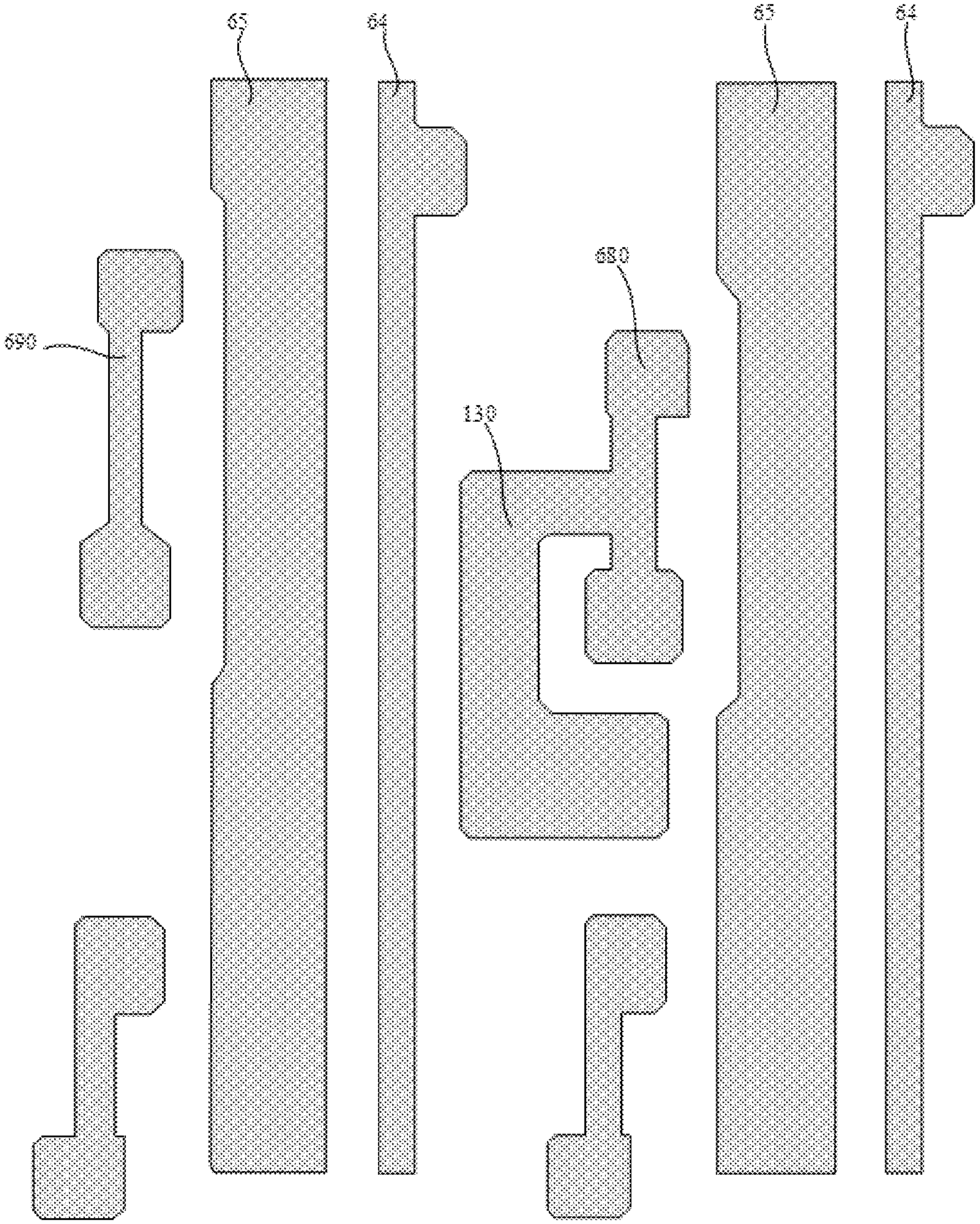

As shown in FIG. 24, the data signal line 64 and the driving voltage line 65 may extend to the second dummy pixel region DMP2. That is, in the second dummy pixel region DMP2, the data signal line 64 and the driving voltage line 65 are located in the third conductive layer 23.

Referring to FIG. 20, the driving voltage line 65 is electrically connected to the second dummy capacitor electrode 220 through a via hole VAH15. In this way, the driving voltage VDD may be supplied to the second dummy capacitor electrode 220.

For example, the driving voltage line 65 may be electrically connected to the second dummy capacitor electrode 220 through more than two via holes VAH15. The two or more via holes VAH15 are arranged at intervals in the second direction Y. In this way, a contact resistance between the driving voltage line and the second dummy capacitor electrode may be reduced.

The display panel may further include a first dummy connection part 690. One end of the first dummy connection part 690 is formed in a via hole VAH16 to form a conductive plug. The conductive plug may extend through the through hole VH3 and is electrically connected to the first dummy capacitor electrode 210.

Corresponding to the sub-pixel, the second dummy sub-pixel structure may further include at least a second transistor T2. The other end of the first dummy connection part 690 is electrically connected to the drain region 205*b* of the second transistor T2 through a via hole VAH17. That is, similar to the connection of the storage capacitor in the equivalent circuit diagram shown in FIG. 6, the dummy capacitor 200 has one end electrically connected to the driving voltage line 65 and the other end electrically connected to the node Ni.

Figure 21:
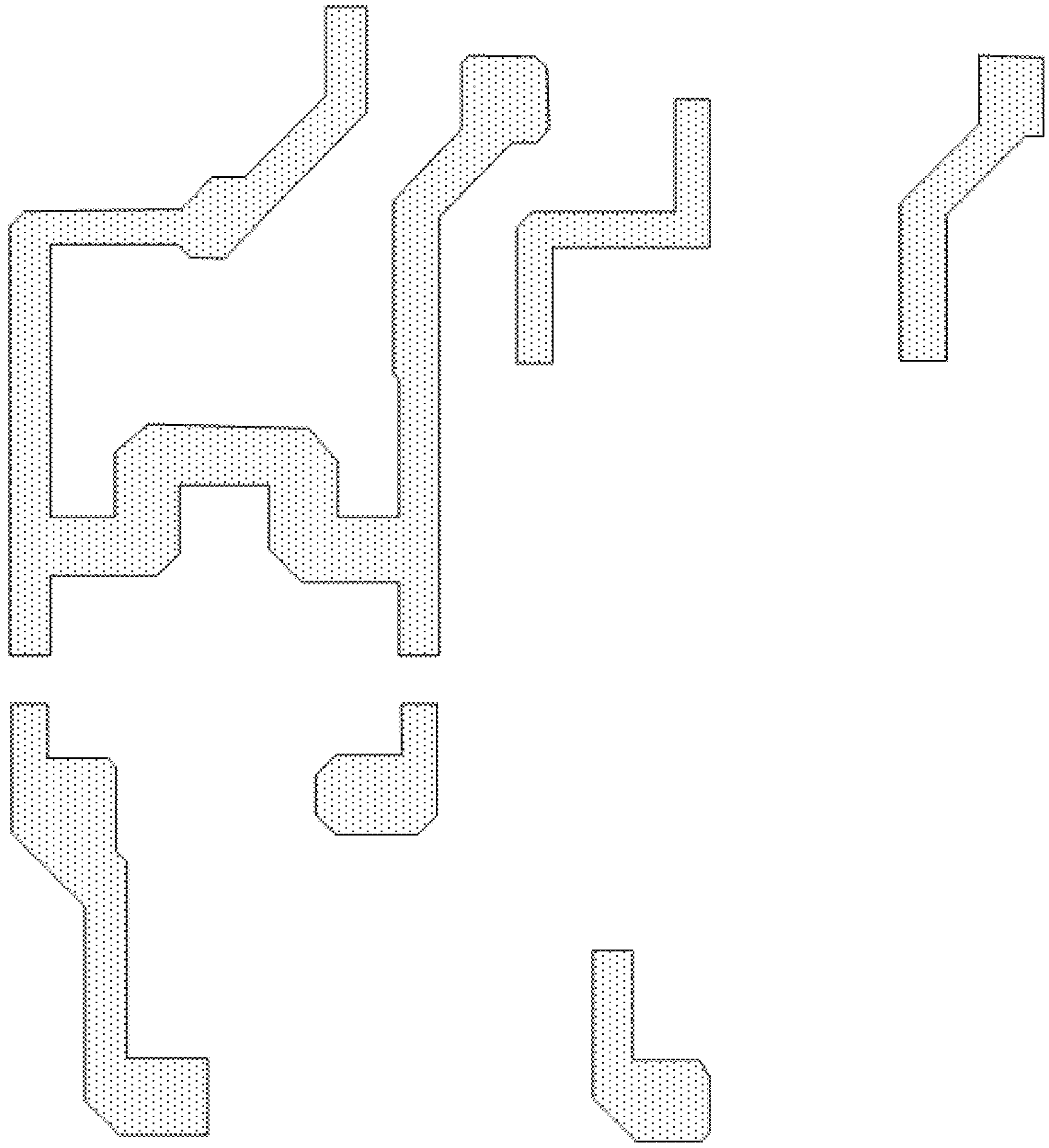
FIG. 21 to FIG. 24 show plan views of some film layers of the exemplary implementation of the first dummy sub-pixel structure and the second dummy sub-pixel structure in FIG. 20, where a semiconductor layer, a first conductive layer, a second conductive layer and a third conductive layer located in a first dummy pixel region and a second dummy pixel region are schematically shown in FIG. 21 to FIG. 24, respectively.

It should be noted that, referring to FIG. 21, in the second dummy pixel region DMP2, the semiconductor layer 20 further includes a plurality of semiconductor parts.

At least some embodiments of the present disclosure further provide a display panel including the display substrate as described above. For example, the display panel may be an OLED display panel.

Referring to FIG. 1, at least some embodiments of the present disclosure further provide a display device that may include the display substrate as described above.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo or smart watch), a television, etc.

It should be understood that the display panel and the display device according to the embodiments of the present disclosure have all the features and advantages of the display substrate described above. The details may be referred to the above description and will not be repeated here.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate comprising a display pixel region, a first dummy pixel region and at least two openings, wherein the first dummy pixel region is located between the at least two openings, and wherein the display substrate comprises:

a base substrate;

a plurality of sub-pixels arranged on the base substrate and located in the display pixel region, wherein the plurality of sub-pixels are arranged in an array in a first direction and a second direction, and each sub-pixel comprises a pixel driving circuit;

a plurality of first dummy sub-pixel structures arranged on the base substrate and located in the first dummy pixel region, wherein at least one first dummy sub-pixel structure comprises a compensation capacitor; and a plurality of scan signal lines arranged on the base substrate and configured to transmit a scan signal to the pixel driving circuit, wherein at least one scan signal line extends through the display pixel region and the first dummy pixel region, wherein the at least one scan signal line is electrically connected to the pixel driving circuit of each sub-pixel in a row of sub-pixels, and is further electrically connected to the compensation capacitor of the at least one first dummy sub-pixel structure;

wherein the display substrate further comprises:

a first compensation connection part, wherein the compensation capacitor comprises a first compensation capacitor electrode, the first compensation connection part has one end electrically connected to the first compensation capacitor electrode and the other end electrically connected to the at least one scan signal line; and a via hole exposing a part of the at least one scan signal line, wherein the other end of the first compensation connection part is electrically connected to the at least one scan signal line through the first via hole, wherein the compensation capacitor further comprises a second compensation capacitor electrode, and an orthographic projection of the first compensation capacitor electrode on the base substrate at least partially overlaps an orthographic projection of the second compensation capacitor electrode on the base substrate;

wherein the second compensation capacitor electrode comprises a first through hole, and an orthographic projection of the first through hole on the base substrate falls within the orthographic projection of the first compensation capacitor electrode on the base substrate; and wherein the display substrate further comprises a second via hole exposing a portion of the first compensation capacitor electrode, and the one end of the first compensation connection part is electrically connected to the first compensation capacitor electrode through the first through hole and the second via hole.

2. The display substrate of claim 1, wherein the pixel driving circuit comprises at least a storage capacitor having a capacitance value less than that of the compensation capacitor.

3. The display substrate of claim 2, wherein the storage capacitor comprises a first storage capacitor electrode and a second storage capacitor electrode, and an orthographic projection of the first storage capacitor electrode on the base substrate at least partially overlaps an orthographic projection of the second storage capacitor electrode on the base substrate; and wherein an orthographic projection of an overlapping portion between the first compensation capacitor electrode and the second compensation capacitor electrode on the base substrate has an area greater than that of an orthographic projection of an overlapping portion between the first storage capacitor electrode and the second storage capacitor electrode on the base substrate.

4. The display substrate of claim 3, wherein the first compensation capacitor electrode and the first storage capacitor electrode are located in a first conductive layer, and the second compensation capacitor electrode and the second storage capacitor electrode are located in a second conductive layer located on a side of the first conductive layer away from the base substrate.

5. The display substrate of claim 4, wherein the third compensation capacitor electrode and the first compensation connection part are located in a third conductive layer located on a side of the second conductive layer away from the base substrate; and/or wherein the third compensation capacitor electrode and the first compensation connection part are connected to each other so as to form a continuously extending integral structure.

6. The display substrate of claim 2, wherein a size of the orthographic projection of the first compensation capacitor electrode on the base substrate in the first direction is greater than a size of the orthographic projection of the first storage capacitor electrode on the base substrate in the first direction; and/or wherein a size of the orthographic projection of the first compensation capacitor electrode on the base substrate in the second direction is greater than a size of the orthographic projection of the first storage capacitor electrode on the base substrate in the second direction; and/or wherein a size of the orthographic projection of the second compensation capacitor electrode on the base substrate in the first direction is greater than a size of the orthographic projection of the second storage capacitor electrode on the base substrate in the first direction; and/or wherein a size of the orthographic projection of the second compensation capacitor electrode on the base substrate in the second direction is greater than a size of the orthographic projection of the second storage capacitor electrode on the base substrate in the second direction.

7. The display substrate of claim 6, wherein a size of the orthographic projection of the first compensation capacitor electrode on the base substrate in the first direction is in a range of 16 microns to 30 microns; and/or wherein a size of the orthographic projection of the first compensation capacitor electrode on the base substrate in the second direction is in a range of 16 microns to 30 microns; and/or wherein a size of the orthographic projection of the first storage capacitor electrode on the base substrate in the first direction is in a range of 10 microns to 16 microns; and/or wherein a size of the orthographic projection of the first storage capacitor electrode on the base substrate in the second direction is in a range of 8 microns to 15 microns; and/or wherein a size of the orthographic projection of the second compensation capacitor electrode on the base substrate in the first direction is in a range of 23 microns to 30 microns; and/or wherein a size of the orthographic projection of the second compensation capacitor electrode on the base substrate in the second direction is in a range of 22 microns to 30 microns; and/or wherein a size of the orthographic projection of the second storage capacitor electrode on the base substrate in the first direction is in a range of 18 microns to 23 microns; and/or wherein a size of the orthographic projection of the second storage capacitor electrode on the base substrate in the second direction is in a range of 10 microns to 15 microns.

8. The display substrate of claim 2, further comprising:

a second dummy pixel region located between the first dummy pixel region and the at least two openings; and a plurality of dummy pixels arranged on the base substrate and located in the second dummy pixel region, wherein each dummy pixel comprises at least a dummy capacitor having a capacitance value substantially equal to that of the storage capacitor.

9. The display substrate of claim 8, wherein the dummy capacitor comprises a first dummy capacitor electrode and a second dummy capacitor electrode, and an orthographic projection of the first dummy capacitor electrode on the base substrate at least partially overlaps an orthographic projection of the second dummy capacitor electrode on the base substrate;

wherein a size of the orthographic projection of the first dummy capacitor electrode on the base substrate in the first direction is substantially equal to a size of the orthographic projection of the first storage capacitor electrode on the base substrate in the first direction; and/or a size of the orthographic projection of the first dummy capacitor electrode on the base substrate in the second direction is substantially equal to a size of the orthographic projection of the first storage capacitor electrode on the base substrate in the second direction; and/or a size of the orthographic projection of the second dummy capacitor electrode on the base substrate in the first direction is greater than a size of the orthographic projection of the second storage capacitor electrode on the base substrate in the first direction; and/or a size of the orthographic projection of the second dummy capacitor electrode on the base substrate in the second direction is greater than a size of the orthographic projection of the second storage capacitor electrode on the base substrate in the second direction.

10. The display substrate of claim 1, wherein the compensation capacitor comprises a first compensation sub-capacitor and a second compensation sub-capacitor connected in parallel.

11. The display substrate of claim 10, wherein the orthographic projection of the first compensation capacitor electrode on the base substrate at least partially overlaps the orthographic projection of the second compensation capacitor electrode on the base substrate so as to form the first compensation sub-capacitor.

12. The display substrate of claim 11, further comprising:

a third compensation capacitor electrode, wherein an orthographic projection of the third compensation capacitor electrode on the base substrate at least partially overlaps the orthographic projection of the second compensation capacitor electrode on the base substrate so as to form the second compensation sub-capacitor.

13. The display substrate of claim 1, further comprising:

a plurality of driving voltage lines arranged on the base substrate and configured to provide driving voltage signals respectively to the plurality of sub-pixels located in the display pixel region, wherein the second compensation capacitor electrode is electrically connected to the driving voltage line.

14. The display substrate of claim 1, further comprising:

a semiconductor layer located on a side of the first conductive layer close to the base substrate, wherein each of an orthographic projection of the first compensation capacitor electrode on the base substrate and an orthographic projection of the second compensation capacitor electrode on the base substrate does not overlap an orthographic projection of the semiconductor layer on the base substrate.

15. The display substrate of claim 1, wherein the at least one scan signal line comprises a $1^{st}$ scan signal line electrically connected to a plurality of sub-pixels and at least one first dummy sub-pixel in a row of sub-pixels and a $2^{nd}$ scan signal line electrically connected to a plurality of sub-pixels and at least one first dummy sub-pixel in another row of sub-pixels; and wherein a number of the sub-pixels electrically connected to the $1^{st}$ scan signal line is less than a number of the sub-pixels electrically connected to the $2^{nd}$ scan signal line, and a number of the first dummy sub-pixels electrically connected to the $1^{st}$ scan signal line is greater than a number of the first dummy sub-pixels electrically connected to the $2^{nd}$ scan signal line.

16. The display substrate of claim 1, wherein the scan signal line extends in the first direction; and wherein in the first dummy pixel region, the plurality of first dummy sub-pixel structures are arranged in both the first direction and the second direction, and a number of the first dummy sub-pixel structures in one row firstly increases and then decreases in the second direction.

17. A display panel comprising the display substrate of claim 1.

* * * * *